United States Patent
Yi et al.

(10) Patent No.: US 10,594,291 B2
(45) Date of Patent: Mar. 17, 2020

(54) BRANCH-LINE COUPLER

(71) Applicant: Futurewei Technologies, Inc., Plano, TX (US)

(72) Inventors: Huairen Yi, Somerset, NJ (US); Zhengxiang Ma, Summit, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 62 days.

(21) Appl. No.: 16/028,816

(22) Filed: Jul. 6, 2018

(65) Prior Publication Data
US 2020/0014363 A1 Jan. 9, 2020

(51) Int. Cl.
| | |
|---|---|
| H01P 5/16 | (2006.01) |
| H01P 5/12 | (2006.01) |
| H03H 7/48 | (2006.01) |
| H03H 7/18 | (2006.01) |
| H01Q 1/24 | (2006.01) |
| H01P 7/06 | (2006.01) |
| H01P 5/18 | (2006.01) |

(52) U.S. Cl.
CPC .............. *H03H 7/482* (2013.01); *H03H 7/18* (2013.01); *H01P 5/18* (2013.01); *H01P 7/06* (2013.01); *H01Q 1/246* (2013.01)

(58) Field of Classification Search
CPC .................................... H01P 5/16; H01P 5/12
USPC .................................................. 333/116, 112
See application file for complete search history.

(56) References Cited

U.S. PATENT DOCUMENTS

| | | | | |
|---|---|---|---|---|
| 5,382,925 A | * | 1/1995 | Hayashi ................... | H03H 1/00 333/112 |
| 7,538,635 B2 | * | 5/2009 | Fukuda .................... | H01P 5/227 333/111 |
| 7,667,555 B2 | * | 2/2010 | Itoh ......................... | H01P 5/227 333/118 |
| 8,773,218 B2 | * | 7/2014 | Wright .................... | H01P 5/227 333/117 |
| 10,218,331 B2 | * | 2/2019 | Zhou ....................... | H01P 5/187 |
| 2016/0343809 A1 | | 11/2016 | Green et al. | |

FOREIGN PATENT DOCUMENTS

| | | |
|---|---|---|
| CN | 201845848 U | 5/2011 |
| CN | 202395137 U | 8/2012 |
| CN | 203434258 U | 2/2014 |
| CN | 104953225 A | 9/2015 |

* cited by examiner

*Primary Examiner* — Dean O Takaoka
(74) *Attorney, Agent, or Firm* — Slater Matsil, LLP

(57) ABSTRACT

A branch line coupler and active antenna system are provided. In an embodiment, the branch line coupler comprises four resonators. The four resonators are formed by a body and a grounded element. A resonator comprises a capacitor element and an inductor element. A first portion of the capacitor element comprises at least a portion of the body and a second portion comprises at least a portion of the grounded element. The inductor element is connected to the capacitor element in parallel. The inductor element comprises at least a portion of the body and extends to the grounded element. The first and second resonators are coupled by a first coupling, the second resonator and the third resonator are coupled by a second coupling, the third resonator and the fourth resonator are coupled by a second third coupling, and the fourth resonator and the first resonator are coupled by a fourth coupling.

20 Claims, 20 Drawing Sheets

SECTION AA

BRANCH-LINE COUPLER

TECHNICAL FIELD

The present disclosure relates to a coupler, and in particular, to a branch line coupler.

BACKGROUND

A branch line coupler is widely used in various kinds of circuits and systems as a basic component, such as a balanced mixer, a balanced amplifier, a power divider, etc.

In some scenarios, for example, in high frequency applications, a size of the branch line coupler is small, and therefore can be integrated onto the surface of a printed circuit board (PCB). Consequently, the branch line coupler can be designed by a single layer PCB or multilayer PCBs.

SUMMARY

In a first aspect, a branch line coupler is provided. The branch line coupler comprises four resonators, i.e., a first resonator, a second resonator, a third resonator, and a fourth resonator. Each of the first resonator, the second resonator, the third resonator, and the fourth resonator comprises an inductor (or an inductor element) and a capacitor (or a capacitor element). The inductor and the capacitor are connected in parallel. The inductor and the capacitor are grounding. The first resonator and the second resonator are coupled by a first coupling, the second resonator and the third resonator are coupled by a second coupling, the third resonator and the fourth resonator are coupled by a third coupling, and the fourth resonator and the first resonator are coupled by a fourth coupling. Thus, the branch line coupler has a better grounding condition, passive intermodulation performance can be improved when a signal is transmitted.

The branch line coupler further comprises four ports, i.e., a first port, a second port, a third port, and a fourth port. The first port is coupled to the first resonator and receives an input signal. The second port is coupled to the second resonator and outputs a direct signal derived from the input signal. The third port is coupled to the third resonator and outputs a coupled signal derived from the input signal. The fourth port is coupled to the fourth resonator and is an isolated port.

In a first possible implementation of the branch line coupler according to the first aspect, each one of the four coupling comprises a capacitive coupling. Alternatively, each one of the four coupling may comprises an inductive coupling. The capacitive coupling or the inductive coupling may generate a ninety degree phase difference in a signal passing from a resonator and another resonator which are coupled by the capacitive coupling or the inductive coupling. Accordingly, the direct signal outputted at the second port will be substantially ninety degree phase-shifted with respect to the coupled signal outputted at the third port. Therefore, the branch line coupler can support a beam forming transmission in a wireless communication.

In a second possible implementation of the branch line coupler according to the first aspect and above implementation, each one of the four ports is connected with a port coupling. The port coupling may couple the each port and a corresponding resonator. The port coupling may transform a port impedance of a port to an internal impedance of a transmission line, which is formed by a coupling between two adjacent resonators in the branch line coupler.

In a third possible implementation of the branch line coupler according to the second implementation, the port coupling may comprise an inductive coupling. In an example, a port may be coupled to a corresponding resonator by an inductor. Optionally, each of the four ports may be connected to a grounding capacitor.

Alternatively, the port coupling may comprise a capacitor coupling. In an example, a port may be coupled to a corresponding resonator by an inductor. Optionally, each of the four port may be connected to a grounding inductor.

For the branch line coupler where each port is connected to a grounding capacitor or a grounding inductor, the grounding capacitor and the inductor, or the grounding inductor and the capacitor may form a band pass filter, which can expand the frequency range of the input signal. Therefore, the bandwidth supported by a wireless system can be expanded.

In a fourth possible implementation of the branch line coupler according to the first aspect and above implementations, each of the four resonators comprises a resonator. In some example, the four resonators are formed by a body and a grounded element, each one of the four resonators includes a capacitor element, with a first portion of the capacitor element comprising at least a portion of the body and with a second portion comprising at least a portion of the grounded element; an inductor element connected to the capacitor element in parallel, with the inductor element comprising at least a portion of the body and extending to the grounded element. The resonator comprises a metal case, which is grounded, and one or more distributed conductor that can conducting a wireless signal. The inductor in the resonator refers to a distributed inductor, which is formed by one or more distributed conductors. The capacitor in the resonator refers to a distributed capacitor, which is formed by one or more distributed conductors and the metal case. The metal case is grounded. Due to the branch line coupler comprises resonators, particularly, the inductor and capacitor of the resonator are formed by conductors and the metal case, the grounding condition is improved significantly, PIM performance can get more improvements, which causes higher wireless communication quality.

In a fifth possible implementation of the branch line coupler according to the fourth possible implementation, the branch line coupler may further comprise an isolation component in the metal case. The isolation component has two ends and both the two ends are connected to the metal case. The isolation component may isolate a coupling between the first resonator and the third resonator, and a coupling between the second resonator and the fourth resonator. With the application of the isolation component, the branch line coupler can be avoided to be out of work and the precision of the branch line coupler can be improved.

In a fifth possible implementation of the branch line coupler according to the first aspect and the above implementations, the first coupling and the third coupling have a first coupling strength, the second coupling and the fourth coupling have a second coupling strength, and the second coupling strength equals the first coupling strength divided by $\sqrt{2}$.

In a second aspect, an active antenna system is provided. The active antenna system comprises a branch line coupler according to the first aspect and its implementations and a frequency selecting component connected to the branch line coupler. The frequency selecting component input a signal, which is selected by the frequency selecting component, to the branch line coupler at the first port of the branch line coupler. The branch line coupler outputs the direct signal at the second port and the coupled signal at the third port. The active antenna system may be used for advanced beam forming (ABF).

In a first possible implementation of the active antenna system according to the second aspect, the frequency selecting component comprises a filter or a diplexer. In some examples, the frequency selecting component is made to form a metal cavity. Therefore, the frequency selecting component can be connected to the branch line coupler easily because both the frequency selecting component and the branch line coupler are metal cavities. Alternatively, the frequency selecting component and the branch line coupler may be made in a same metal cavity. Therefore, the fabrication cost can be reduced.

In a second possible implementation of the active antenna system according to the second aspect and the first possible implementation of the second aspect, the active antenna system further comprises an antenna. The direct signal and the coupled signal are transmitted to the antenna. Optionally, the branch line coupler may receive a signal from the antenna at an input port, and outputs a direct signal and a coupled signal at two output port to the frequency selecting component. Therefore, high quality can be realized for the signal transmitting and receiving.

In a third aspect, a base station is provided. The base station comprises an active antenna system according to the second aspect and its implementations, and a baseband unit. The baseband unit may comprise a baseband processor. The baseband processor outputs a signal to the active antenna system, and can receive a signal from the active antenna system. With the implementation of the active antenna system, which incorporates the branch line coupler described above, the wireless communication quality of the base station is improved and the fabrication cost can also be reduced accordingly. Moreover, the bandwidth of the system frequency can be expanded and more traffic throughput can be supported.

BRIEF DESCRIPTION OF DRAWINGS

For a more complete understanding of the present disclosure, and the advantages thereof, reference is now made to the following descriptions taken in conjunction with the accompanying drawing, in which.

DESCRIPTION OF EMBODIMENTS

The structure, manufacture and use of the presently embodiments are discussed in detail below. The specific embodiments discussed are merely illustrative of specific ways to make and use the disclosure, and do not limit the scope of the disclosure.

Figure 1:
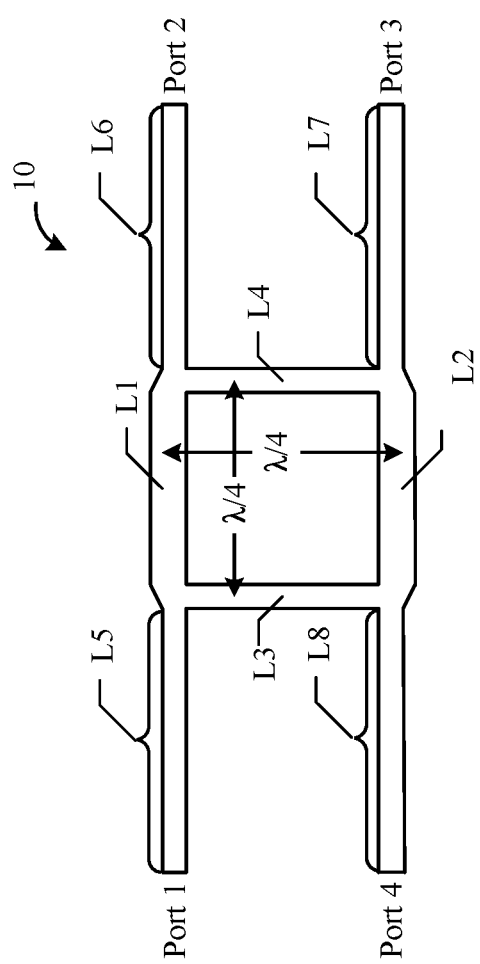
FIG. 1 is a diagram of a branch line coupler.

FIG. 1 is a diagram of prior art a branch line coupler 10. The prior art branch line coupler 10 comprises four transmission lines, i.e., two main transmission lines (also known as horizontal parallel transmission lines) L1 and L2, and two branch lines (also known as vertical parallel lines) L3 and L4. The two main transmission lines L1 and L2 are connected by the two branch lines L3 and L4. The four transmission lines L1-L4 are also known as the four arms of the branch line coupler 10. Each one of the two branch lines L3 and L4 has a characteristic impedance equal to $Z_0$. Each one of the two main transmission lines L1 and L2 has a characteristic impedance equals to $Z_0/\sqrt{2}$. Each line of the four transmission lines L1-L4 has a length equal to a quarter-wavelength $\lambda/4$, where $\lambda$ represents a wavelength.

The branch line coupler 10 has four ports, i.e., a first port (port 1), a second port (port 2), a third port (port 3), and a fourth port (port 4). The four ports L5-L8 can be connected to electrical transmission lines, cables, or other electrical conductor elements. One port is an input port, two ports are output ports, and the remaining one port is an isolated port. The branch line coupler 10 may split a signal inputted from the input port into two output ports. A power of the signal inputted from the input port may be equally divided between the output ports, and the signals at the two outputs have a 90 degree phase difference (or phase shift) with respect to each other. For example, as shown in FIG. 1, the port 1 may be an input port, the ports 2 and 3 are output ports, and the port 4 is an isolated port. A power signal is inputted to port 1 and is split into the two output ports 2 and 3. In an example of the port 1 is an input port, the port 1 receives an input signal, a signal derived from the input signal is outputted from the port 2, and a signal derived from the input signal is outputted from the port 3. The signal outputted from the port 2 is transmitted through the main transmission line L1 directly, thus, the signal outputted from the port 2 is also referred to a direct signal. The signal outputted from the port 3 is transmitted through the branch transmission line L4, the signal outputted from the port 3 is also referred to a coupled signal.

Each port may be coupled to a transmission line of a characteristic impedance $Z_0$. The transmission lines L5, L6, L7, and L8 have a same characteristic impedance as the characteristic impedance of the branch lines L3 and L4.

The branch line coupler in the present disclosure also refers to a branch line hybrid, a ninety degree (90°) hybrid coupler, a hybrid, and so on.

Figure 2:
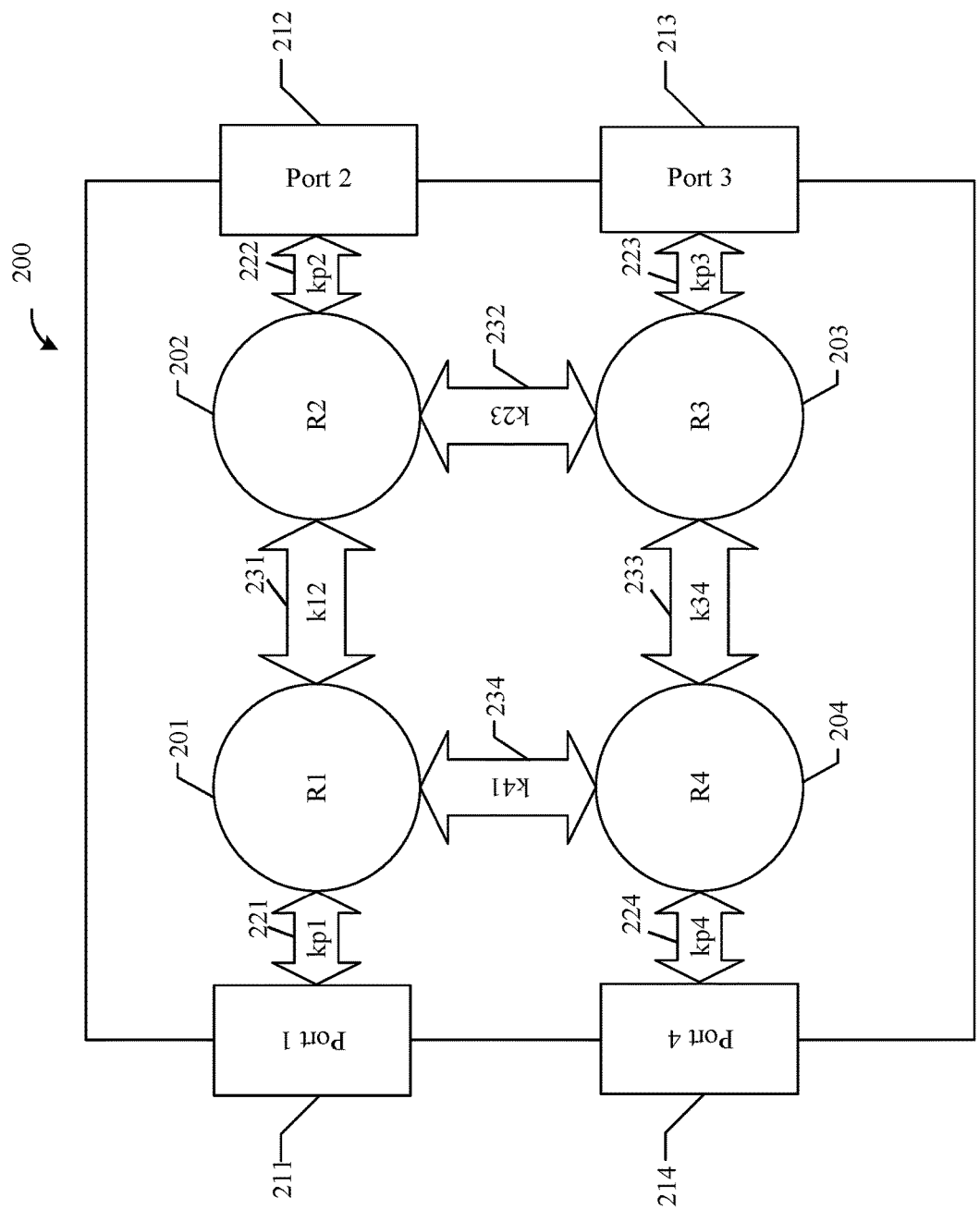
FIG. 2 is a diagram of a branch line coupler in an embodiment.

FIG. 2 is a diagram of a branch line coupler 200 according to an embodiment. The branch line coupler 200 comprises four resonators R1-R4, i.e., a first resonator R1 201, a second resonator R2 202, a third resonator R3 203, and a fourth resonator R4 204. A pair of adjacent resonators are coupled by a coupling, the coupling between two resonators can produce a ninety degree phase difference between the two resonators. Four resonators are coupled to realize a branch line coupler in embodiments of the present disclosure.

A branch line coupler 200 may be widely used in various kinds of circuits and systems as a basic component. As an important component of an active antenna system (AAS), the branch line coupler 200 may substantially affect the performance of the AAS. The present application discloses embodiments of a branch line coupler 200 that has a high performance and that with less fabrication complexity.

The branch line coupler 200 further comprises port 1 211, port 2 212, port 3 213, and port 4 214. The branch line coupler 200 can advantageously spilt an input signal into signals at two output ports. The branch line coupler 200 can advantageously spilt the input signal equally between the two output ports. The signal at the second output port will be substantially ninety degree phase-shifted with respect to the signal at the first output port. Any of the four ports 1-4 211-214 can be an input port, and the other two ports are output ports. The remaining one is termed an isolated port. Port 1 211 is coupled to the first resonator R1 201 by a first port coupling kp1 221. Port 2 212 is coupled to the second resonator R1 202 by a second port coupling kp2 222. Port 3 213 is coupled to the third resonator R3 203 by a third port coupling kp3 223. Port 4 214 is coupled to the fourth resonator R4 204 by a fourth port coupling kp4 224.

The first resonator R1 201 is coupled to the second resonator R2 202 by a first coupling k12 231. The second resonator R2 202 is coupled to the third resonator R3 203 by a second coupling k23 232. The third resonator R3 203 is coupled to the fourth resonator R4 204 by a third coupling k34 233. The fourth resonator R4 204 is coupled to the first resonator R1 201 by a fourth coupling k41 234.

In one example, a port impedance $Z_0$ of the ports 1-4 211-214 may be 50Ω because this value is the most commonly used in industry. $Z_0$ is not limited to a specific value and may also be set to other values based on the actual requirements. The coupling k23 232 and the coupling k41 234 have a characteristic impedance equal to the internal impedance $Z_1$, and the coupling k12 231 and the coupling k34 233 have a characteristic impedance equal to $Z_1/\sqrt{2}$. The port couplings kp1-kp4 221-224 may generate an impedance match between the port impedance $Z_0$ and an internal impedance $Z_i$ of the branch line coupler 200, such as transforming the internal impedance $Z_i$ to the port impedance $Z_0$. $Z_i$ may be equal to or less than $Z_0$.

The port 1 211 receives an input signal. A direct signal is outputted from the port 2 212, with the direct signal derived from the input signal. A coupled signal is derived from the input signal and is outputted form the port 3 213.

In embodiments of the present disclosure, each one of the resonators R1-R4 201-204 resonates at a particular frequency or frequency band when an electromagnetic signal at the frequency or frequency band is inputted to the resonator. In the branch line coupler 200, each of the four resonators R1-R4 201-204 may resonate at substantially the same frequency or frequency band. Through proper design of the four resonators R1-R4 201-204, the branch line coupler 200 can be constructed to operate at a desired frequency or frequency range.

A resonator in some examples can comprise a hollow region in an electrically conductive material. For example, the hollow region can be filled with air, a specific gas, or a substantial vacuum. Alternatively, the resonator may comprise a hollow region filled with a dielectric or non-conductive material. It should be understood, however, that the resonant frequency of a resonator can be adjusted or varied to some degree, such as by varying the size and/or shape of the cavity. For example, a cavity may include movable or adjustable walls, wherein the cavity size or shape can be varied in order to affect the resonant frequency.

Figure 3:
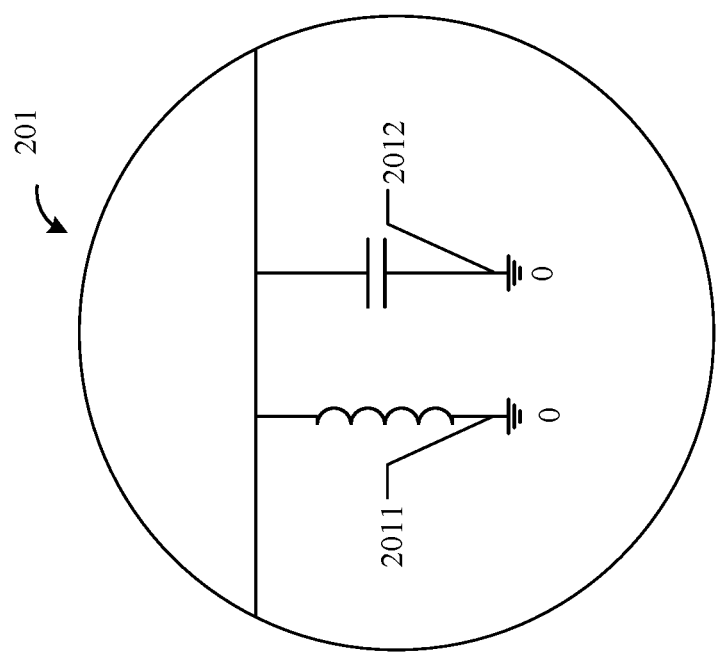
FIG. 3 is a diagram of a resonator in an embodiment.

FIG. 3 is a diagram of a resonator 201 in an embodiment. Each of the resonators R1-R4 201-204 may be represented by an equivalent electrical circuit comprising an inductor (or an inductor element) 2011 and a capacitor (or a capacitor element) 2012, wherein the inductor and capacitor elements form an electronic resonator circuit. The resonator R1 201 may be represented as an inductor 2011 and a capacitor 2012, connected in parallel. Each of the inductor and the capacitor has two ends and one of the two ends is a grounding end, i.e., the end is connected to a ground. For instance, both the inductor 2011 and the capacitor 2012 have a grounding end. In an example, the ground is a reference point in an electrical circuit from which voltages are measured, a common return path for electric current, or a direct or indirect physical connection to the earth. An inductor having a grounding end may be referred to a grounding inductor, and a capacitor having a grounding end may be referred to a grounding capacitor. This grounding aspect beneficially reduces passive intermodulation (PIM) in the branch line coupler 200, and will be discussed in more detail below. In an example, a resonance frequency f of the resonators R1-R4 201-204 may be set according to an equation: $f=1/(2\pi*\sqrt{LC})$, where L represents a value of inductance of the inductor 2011 in Henrys and C represents a value of capacitance of the capacitors 2012 in Farads.

In some examples, the four resonators R1-R4 201-204 are formed by a body and a grounded element. Each of the resonators R1-R4 201-204 comprise a capacitor element, a first portion of the capacitor element comprises at least a portion of the body and a second portion comprises at least a portion of the grounded element. Each of the resonators R1-R4 201-204 further comprises an inductor element connected to the capacitor element in parallel, the inductor element comprises at least a portion of the body and extends to the grounded element. In an example, the grounded element may include a metal case (or electrically conductive case or cavity), or a conductor connected to the metal case. The body includes an integral component in the metal case, or multiple components connected with each other, or discrete components inside the metal case.

In embodiments of the present disclosure, an inductor is a passive electrical component that stores energy in a magnetic field when electric current flows through the inductor, wherein the amount of energy stored by the magnetic field is quantified as inductance. An inductor opposes changes in electrical current. The inductance measure is the ratio of the voltage to the rate of change in current. It should be understood that the component may comprise multiple distributed elements or components, wherein the distributed elements or components may combined together to work as the inductor 2011. For example, each of two metal conductors possesses inductance, where the two metal conductors are connected to each other as a whole and work as an inductor 2011. The inductor 2011 formed by multiple components may be referred to a distributed inductor 2011. In some embodiments, the inductor 2011 may therefore comprise a metal conductor that may possess inductance when a signal passes through, such as a metal wire, a metal piece, or a coil. The metal conductor generates self-inductance in the presence of a signal. In an example, the signal may comprise a high frequency signal, such as a signal with a frequency above 300 MHz. It should be noted that the frequency is not limited to the example.

A capacitor 2012 in the embodiments refers to a passive electrical component that stores energy in an electric field when a voltage potential exists across the capacitor 2012, wherein the amount of energy stored by the electric field is quantified as capacitance. The capacitor 2012 will conduct a current through itself when a time-varying voltage is applied. The capacitive coupling is the transfer of a signal between the two conductors by means of displacement current induced by an electric field. The capacitor 2012 may comprise a pair of conductors separated by a gap or by an electrical insulator material. The insulator may be air or any other electrical insulating material. The capacitor 2012 may comprise distributed elements or components, namely, multiple distributed elements or components may be additive and may generate a desired capacitance value. In the embodiments of the present disclosure, the capacitor 2012 is formed by distributed components or elements, and can be referred to as a distributed capacitor 2012.

In some examples, the components forming the inductor 2011 and the capacitor 2012 include an electrically conductive case and multiple electrically conductive components. The electrically conductive components are placed inside the electrically conductive case, wherein some of the electrically conductive components connect to the electrically conductive case and some of the electrically conductive components are not connected to the electrically conductive case. The electrically conductive components may form one or more inductors 2011. There is a gap or space between the electrically conductive components and the electrically conductive case, or between the electrically conductive components and an electrically conductive component that is connected to the electrically conductive case. A resonator formed by such inductor(s) and capacitor(s), within the cavity of the metal case 520, may be referred to as a cavity resonator (see FIGS. 5A-5I).

In one example, the resonators R1-R4 201-204 may be constructed from a quarter-wave coaxial resonator, with one end of the center conductor coupled to ground.

Referring again to FIG. 2, the first resonator R1 201 and the second resonator R2 202 are coupled by a coupling k12 231, the second resonator R2 202 and the third resonator R3 203 are coupled by a coupling k23 233, the third resonator R3 203 and the fourth resonator R4 204 are coupled by a coupling k34 233, and the forth resonator R4 204 and the first resonator R1 201 are coupled by a coupling k41 234.

The couplings k12 231, k23 232, k34 233, and k41 234 can successively introduce 90 degree phase shifts between the successive connected resonators. Namely, the coupling k12 231 can introduce a 90 degree phase difference between the resonators R1 201 and R2 202, the coupling k23 232 can introduce a 90 degree phase difference between the resonators R2 202 and R3 203, the coupling k34 233 can introduce a 90 degree phase difference between the resonators R3 203 and R4 204, and the coupling k41 234 can introduce a 90 degree phase difference between the resonators R4 204 and R1 201. Thus, the coupling k12 231 causes a ninety degree phase difference in a signal flowing from the resonator R1 201 and the resonator R2 202. The coupling k23 232 causes a ninety degree phase difference in a signal flowing from the resonator R2 202 and the resonator R3 203. The coupling k34 233 causes a ninety degree phase difference in a signal flowing from the resonator R2 202 and the resonator R3 203. The coupling k41 234 causes a ninety degree phase difference in a signal flowing from the resonator R4 204 and the resonator R1 201.

Coupling strength of the couplings k12 231, k23 232, k34 233, and k41 234 may be set according to a coupling coefficient. The coupling coefficient is a dimensionless value that characterizes interaction of the two resonators. In one example, the coupling strength of the coupling k12 231 equals the coupling strength of the coupling k34 233, while the coupling strength of the coupling k23 232 equals to the coupling strength of the coupling k41 234. In this embodiment, the coupling strength of the coupling k23 232 and k41 234 equals the coupling strength of the couplings k12 231 or k34 233 divided by $\sqrt{2}$. With stronger coupling strength, a wider operational bandwidth can be achieved. The bandwidth, which can also be referred to as an impedance bandwidth, refers to a range of frequencies over which a given return loss can be maintained. The bandwidth is typically paired with a given return loss or voltage standing wave ratio (VSWR) value.

The coupling between a pair of adjacent resonators may comprise an impedance inverter, which is also known as a K-inverter. Adjacent resonators may be coupled by an inductive coupling, which refers to a coupling through an inductance linked by a common changing magnetic field. The coupling between a pair of resonators optionally may comprise a capacitive coupling. The capacitive coupling refers to a coupling or connection by means of a device that possesses a capacitance effect, such as a capacitor, wherein the electrical interaction between two resonators is caused by a capacitance effect between them.

In this embodiment, the port couplings kp1-kp4 221-224 may comprise an inductive coupling. Alternatively, the port couplings kp1-kp4 221-224 may comprise a capacitive coupling. In some examples, in the inductive coupling, a voltage of a signal leads a current of the signal by ninety degrees. Conversely, in a capacitive coupling embodiment, the voltage lags the current by ninety degrees.

The interaction of mechanical components generally causes the nonlinear elements, especially anywhere that two different metals come together. Junctions of dissimilar materials are a prime cause. PIM occurs in antenna elements, coax connectors, coax cable, and grounds. Insufficient grounding is a key factor in causing PIM. A better grounding condition may improve the PIM performance. Conversely, a worse grounding condition may cause more PIM and the transmission performance in a network can drop.

The PIM level may be represented by a specific value with a unit of a decibel-milliwatts (dBm). A lower PIM level means a better PIM performance.

A wireless high speed data network uses tightly grouped channels and complex modulation schemes to enable the transmission of vast amounts of data. Such a wireless high speed data network, in association with ultra-sensitive receivers, may face unanticipated but serious capacity losses if the network is disturbed by PIM. PIM is a form of intermodulation distortion that occurs in components normally thought of as linear components, such as cables, connectors and antennas. PIM is interference resulting from the nonlinear mixing of two or more frequencies in a passive circuit. Modulating such radio frequency signals is necessary to transport information, but arbitrary PIM can significantly impact radio frequency signal performance. Unwanted PIM may desensitize one or more receiving channels to such a degree that it causes a very high bit error rate (BER), which in turn reduces network bandwidth. The existence of more than minor levels of PIM may even lead to communications being disrupted. In a worst case scenario, it can even lead to permanently unusable receiver channels.

Loss of already sparse network capacity, caused by PIM, is unacceptable for high volume, high speed wireless data networks. The PIM can happen whenever more than one signal is channeled through a radio frequency path, such as when two or more signals are present in a passive non-linear device or element. The signals will mix or multiply with each other to generate other unwanted signals, with the unwanted signal being related to the original signals.

In embodiments of the present disclosure, since the branch line coupler 200 is designed by incorporating the resonators including grounding inductors and grounding capacitors, the couplings k12-k41 between the resonators are used to realize the branch line coupler 200, which provides a better grounding performance. The branch line coupler 200 improves PIM performance of the wireless high speed transmission. Furthermore, the design of the branch line coupler may alleviate design complexity and fabrication cost.

Figure 4:
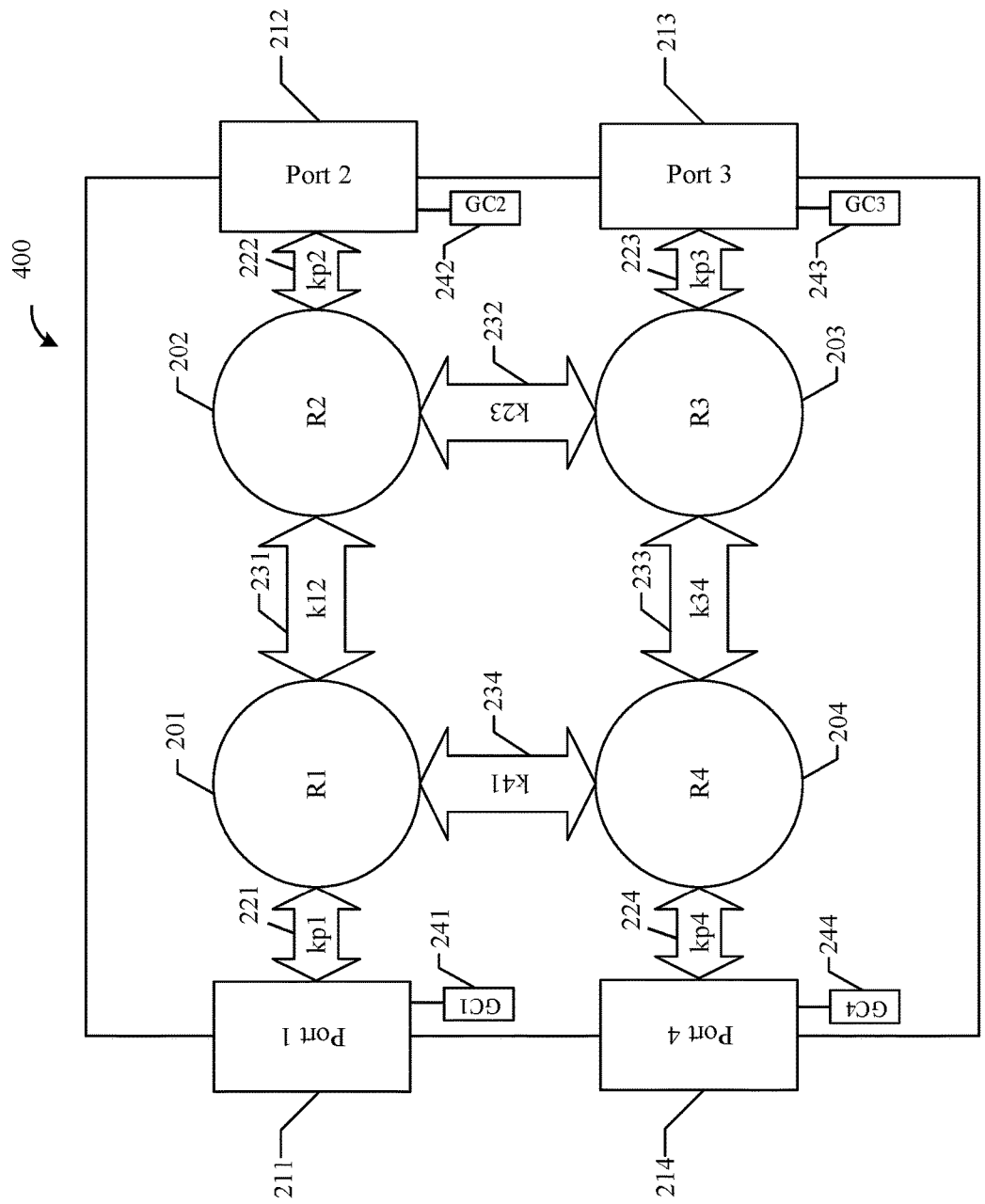
FIG. 4 is a diagram of a branch line coupler in an embodiment.

FIG. 4 is a diagram of a branch line coupler 400 in an embodiment. The branch line coupler 400 is similar to the branch line coupler 200 except for four extra grounding components (GC1-GC4) 241-244. Each of the grounding components 241-244 has a grounding end and an other end that is connected to a corresponding port of port 1 211, port 2 212, port 3 213, or port 4 214.

In one example, for a port whose port coupling kp1-kp4 221-224 is an inductive coupling, each one of the grounding components 241-244 comprises a grounding capacitor. For a port whose port coupling kp1-kp4 221-224 is a capacitive coupling, each one of the grounding components 241-244 comprises a grounding inductor.

In this embodiment, the grounding components 241-244, together with the port couplings 221-224, may form parallel resonance circuits and work as band pass filters in some embodiments. In other embodiments, in an example where the port couplings 221-224 comprise inductors and the grounding components 241-244 comprise grounding capacitors, low pass filters are therefore formed. In yet other embodiments, in an example where the port couplings 221-224 comprise capacitors and the grounding components 241-244 comprise grounding inductors, high pass filters are therefore formed.

Figure 5A:
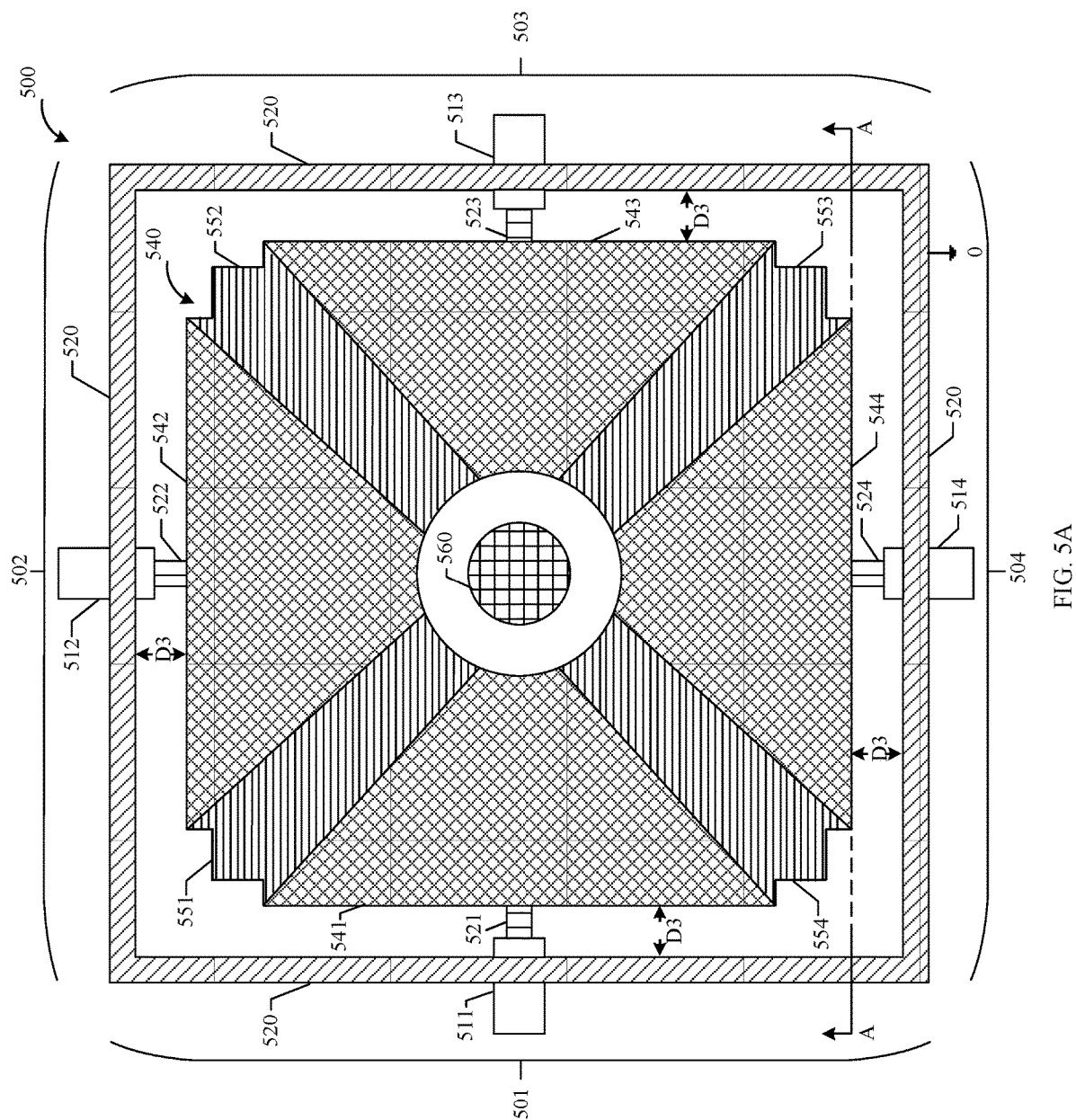
FIGS. 5A-5K are diagrams of a branch line coupler in embodiments.
Figure 5B:
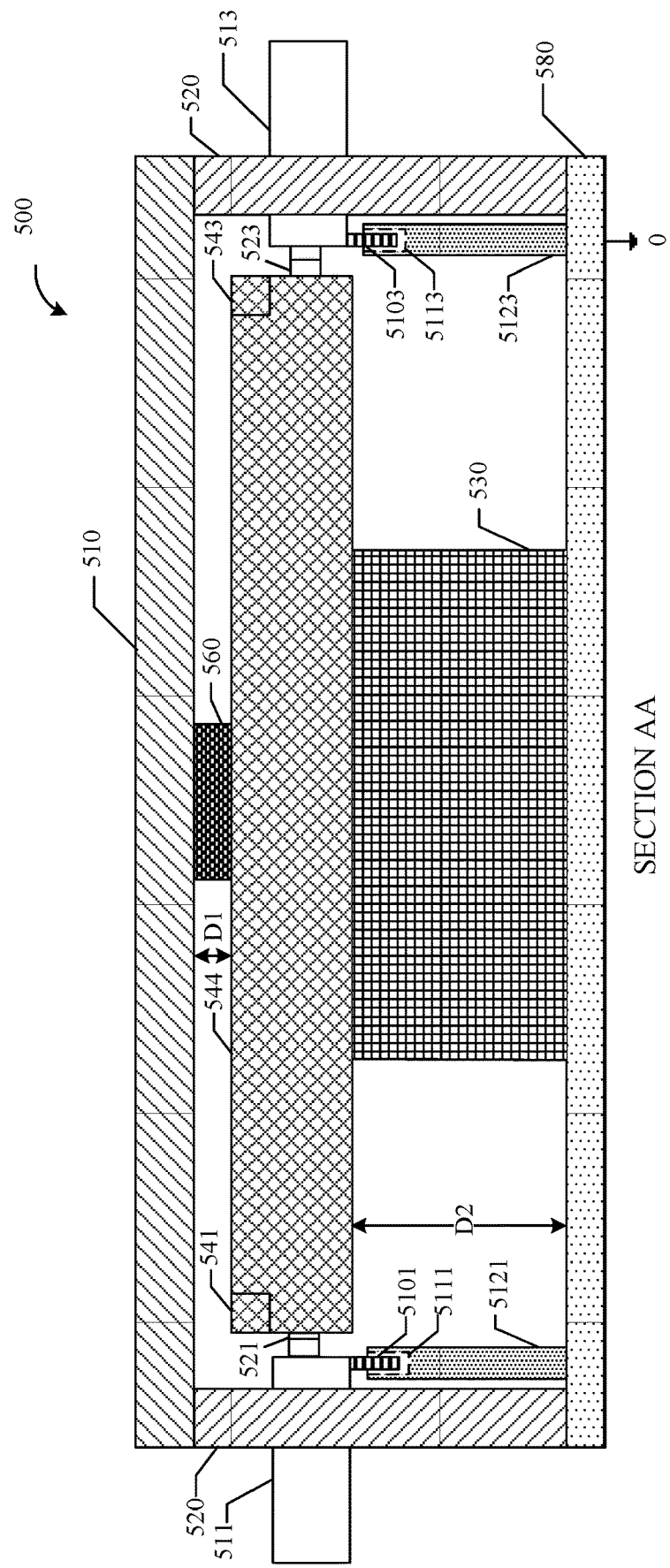
Figure 5C:
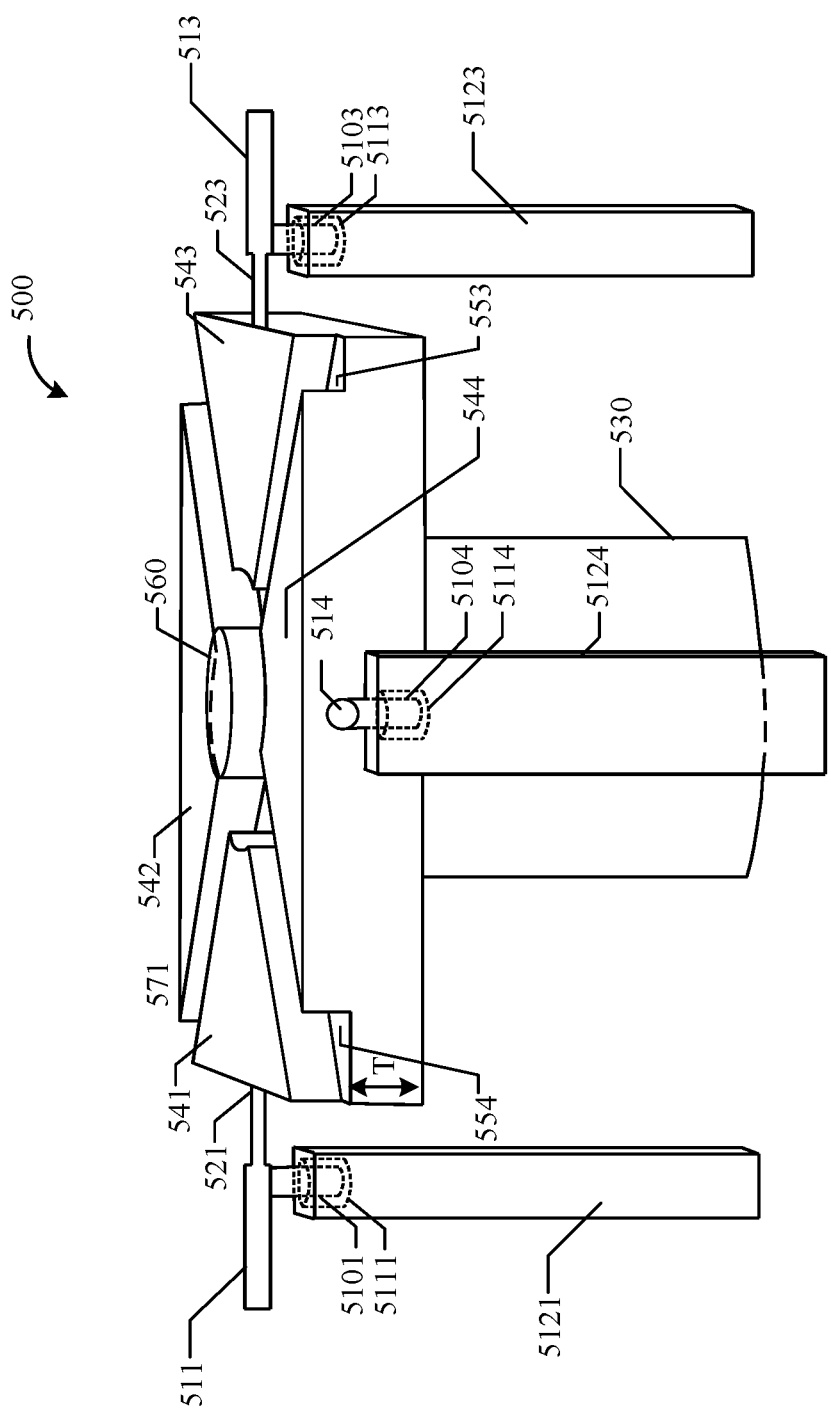

FIGS. 5A-5C are diagrams of a branch line coupler 500 according to an embodiment. FIG. 5A is top view of the branch line coupler 500 without a cover 510. FIG. 5B is a cross-sectional diagram AA of the branch line coupler 500 from the front. FIG. 5C is a diagram of internal components of the branch line coupler 500.

FIG. 5A is a top view of the branch line coupler 500. The branch line coupler 500 in the embodiment shown includes the cover 510, walls 520, and a bottom 580. The cover 510, the walls 520, and the bottom 580 are made up of metal material and form a metal case, which is grounded. The branch line coupler 500 further comprises a body 540 comprising four metal pieces 541-544, with the body 540 being located within the metal case. The four metal pieces 541-544 are surrounded, but do not touch, by the walls 520 of the metal case.

Four ports 511-514 emerge from the metal case 520, with the four ports 511-514 being electrically coupled to four resonators R1-R4 501-504 inside the branch line coupler 500. The ports 1-4 511-514 are coupled to the body 540 (and therefore are coupled to four resonators R1-R4 501-504 of the body 540), by port coupling kp1-kp4 521-524. Each of the ports 1-4 511-514 may be coupled to a metal piece 541-544 by a corresponding port coupling kp1-kp4 521-524. The port couplings kp1-kp4 521-524 in some embodiments comprise metal conductors. The port couplings kp1-kp4 521-524 in some embodiments comprise metal conductors which function as inductors when a signal passes through the port couplings kp1-kp4 521-524. The port 1 511 and the metal piece 541 are coupled by a metal conductor 521, the port 2 512 and the metal piece 542 are coupled by a metal conductor 522, the port 3 513 and the metal piece 543 are coupled by a metal conductor 523, and the port 4 514 and the metal piece 544 are coupled by a metal conductor 524. In the embodiment shown, the ports 1-4 511-514 pass through apertures in the sidewalls 520 and may clamp to or be affixed to the sidewalls 520. Further, the affixing of the ports 511-514 to the sidewalls 520 can hold the body 540 in position within the metal case, including affixing the body 540 at predetermined distances from the metal case for the purpose of completing capacitor components of the branch line coupler 500. Alternatively, the ports 1-4 511-514 are located outside of the walls 520, and the metal conductors 521-524 pass through the walls 520 and connect to the ports 1-4 511-514.

The port couplings kp1-kp4 521-524 are inductive couplings in some embodiments. Optionally, each of the ports 1-4 511-514 is connected to a grounding capacitor.

The four metal pieces 541-544 are connected to a metal base 530 which is connected to the bottom 580. Optionally, the four metal pieces 541-544 and the metal base 530 can be an integral unit. The four metal pieces 541-544 are spaced a predetermined distance D1 from the cover 510, and a predetermined distance D2 from the bottom 580 (see FIG. 5B). Each metal piece 541-544 is spaced a predetermined distance D3 from the closest wall 520, as shown in FIG. 5B. When a signal is transmitted to the metal pieces 541-544, the signal is also transmitted to the bottom 580 through the metal base 530. The metal base 530 and each of the metal pieces 541-544 form an inductor in some embodiments. Due to the inductor being formed by multiple inductance-contributing components, such an inductor is also referred to a distributed inductor. In embodiments of present disclosure, the cover 510, the walls 520, and the bottom 580 are grounded. Since the metal base 530 contacts to the bottom 580, i.e., the exterior metal case of the branch line coupler 500, one end of such inductor is a grounding end.

Figure 5D:
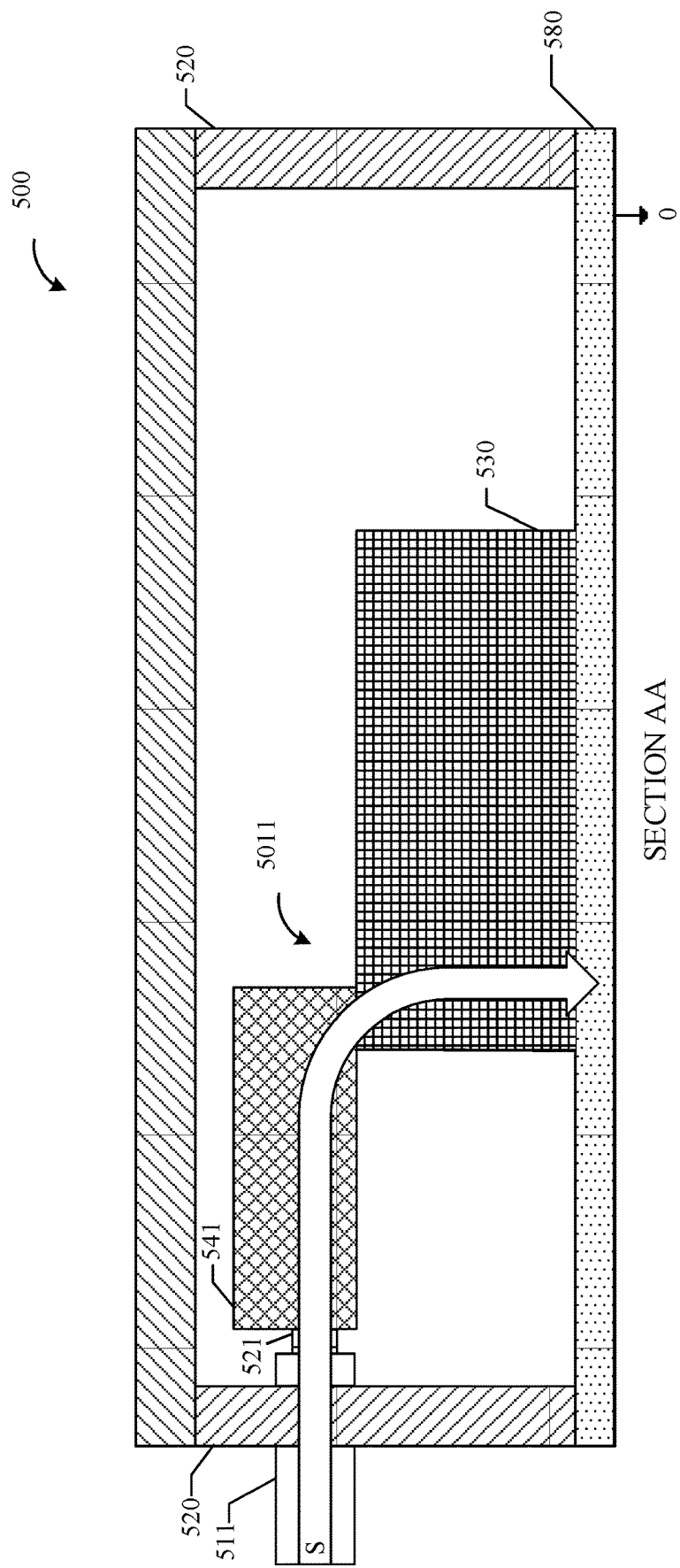

FIG. 5D is a diagram of an inductor 5011 in the first resonator 501 in an embodiment. A signal S is imputed at the port 1 511, and is transmitted to the metal piece 541 through the port coupling 521. The signal S then passes from the metal piece 541 to the metal base 530, and finally passes to the bottom 580, which is grounded. The metal piece 541 and the metal base 530 can generate self-inductance in the presence of the signal S1. Therefore, the metal piece 541 and the metal base 530 may form the inductor 5011 of the first resonator 501. Since the metal base 530 is connected to the bottom 580, thus, the one end of the inductor 5011 is grounded, the inductor 5011 is a grounding inductor. When a signal is passed through the metal pieces 542-544 and the metal base 530, grounding inductors of the second to fourth resonators 502-504 can be similarly formed.

The four metal pieces 541-544 and the cover 510, the bottom 580, and/or the walls 520 may also form different grounding capacitors. Such a capacitor may be referred to as a distributed capacitor. The metal piece 541 can form capacitor elements with respect to the cover 510, the bottom 580, or the wall 520 at the left side of FIG. 5A. The metal piece 541 can form a capacitor element by forming a small gap (or air gap) between two conductive plates or bodies, wherein electrical energy is stored and discharged due to electric potential between the two conductive plates or bodies. In some examples, the predetermined distance D1, D2, or D3 may be multiple mils or more than 10 mils (a mil is a length unit equal to a thousandth of an inch). It should be noted that embodiments of the present disclosure do not limit the specific length of the predetermined distance D1, D2, or D3. Alternatively, a distance D3 between a metal piece and the wall may be different from another distance D3 between another metal piece and the wall.

Similarly, the metal piece 542 can form capacitor elements with respect to the cover 510, the bottom 580, or the wall 520 at the back side in the figure. The metal piece 543 can form capacitor elements with respect to the cover 510, the bottom 580, or the wall 520 at the right side in the figure. The metal piece 544 can form capacitor elements with respect to the cover 510, the bottom 580, or the wall 520 at the front side in the figure. Each one of the metal pieces 541-544 can therefore comprises one portion or end of a capacitor element, and the cover 510, the bottom 580, or the wall 520 comprise another portion or end.

Figure 5E:
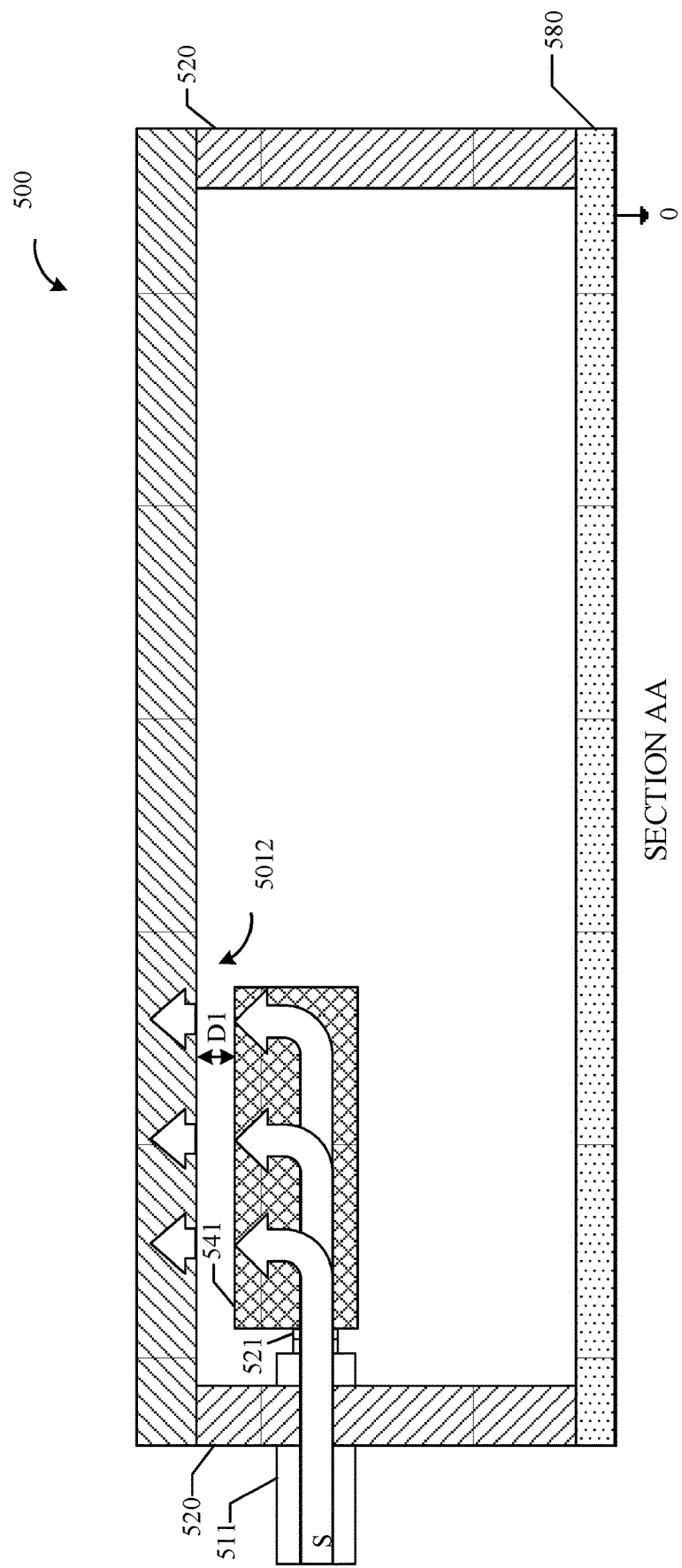

FIG. 5E is a diagram of a capacitor 5012 (or a capacitor element) in the first resonator 501 in an embodiment. The signal S is inputted at the port 1 511, and is transmitted to the metal piece 541 through the port coupling 521. The metal piece 541 and the cover 510 form the capacitor 5012, with a gap D1 therebetween. Because the cover 510 is grounded, the one (i.e., upper) portion of the capacitor 5012 is grounded. Thus, the capacitor 5012 is a grounding capacitor. When a signal is passed through the metal pieces 542-544, the metal pieces 542-544, together with the cover 510, may similarly form grounding capacitors of the second to fourth resonators 502-504. It should be understood that the capacitor 5012 is just an example, the first resonator 501 may comprise more capacitors, such as capacitors formed by the metal piece 541 and at least one of the bottom 580, the wall 520 at the right side in the figure, or the metal rod 591.

Figure 5F:
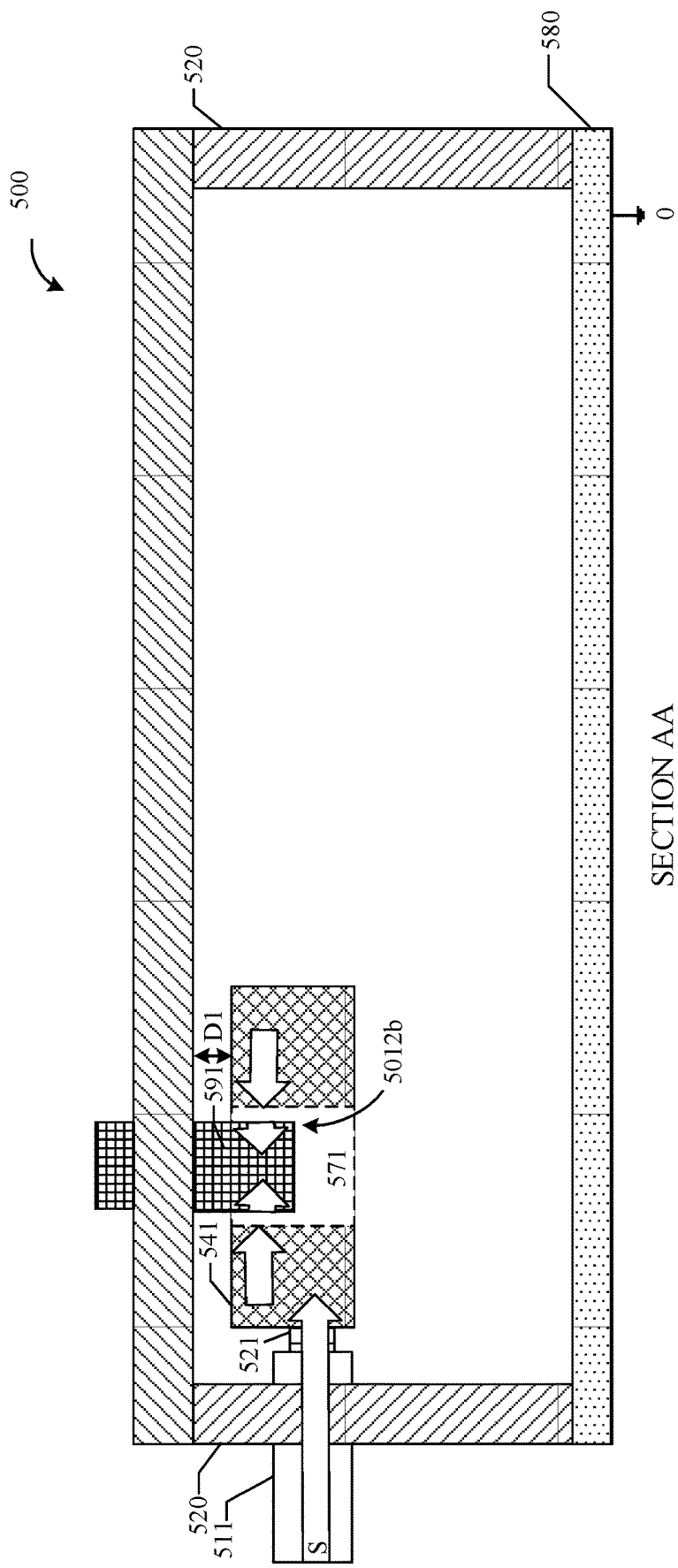
Figure 5G:
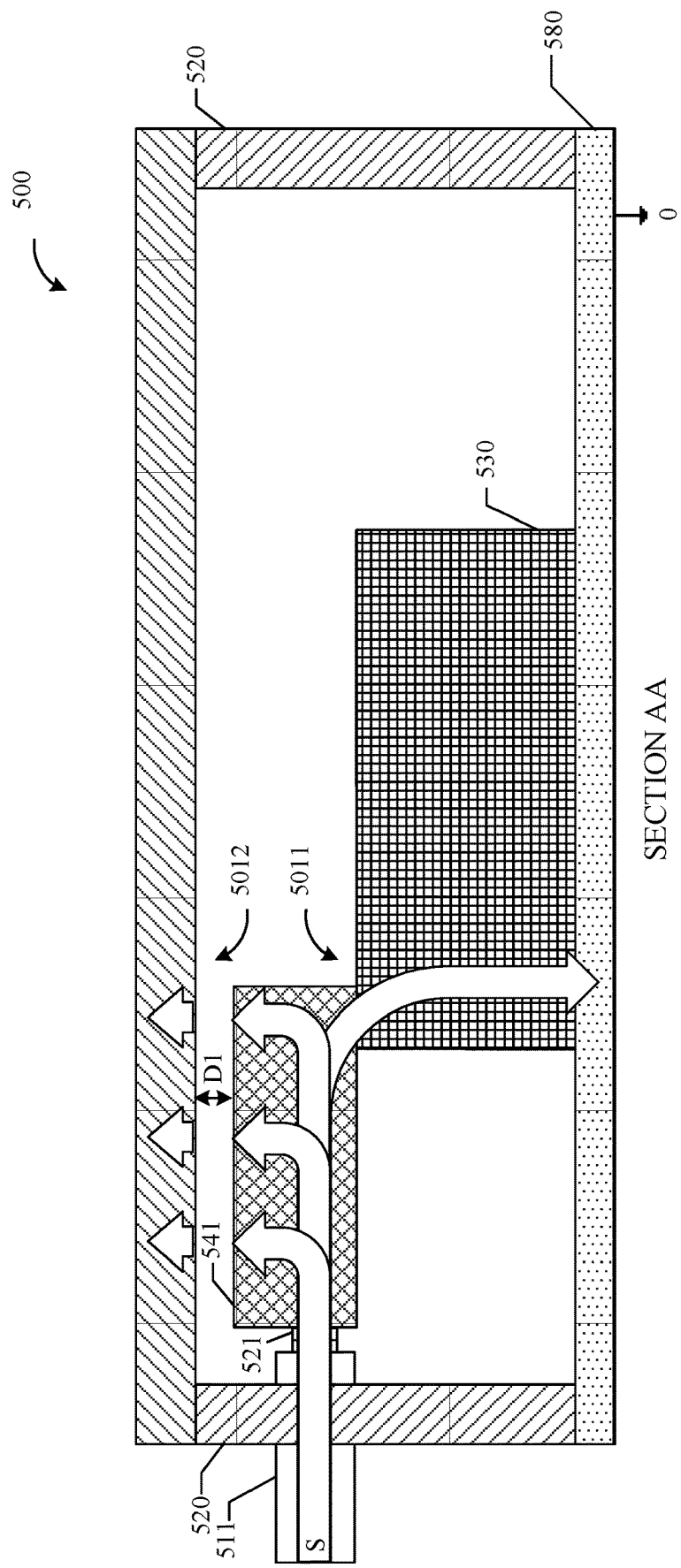
Figure 5H:
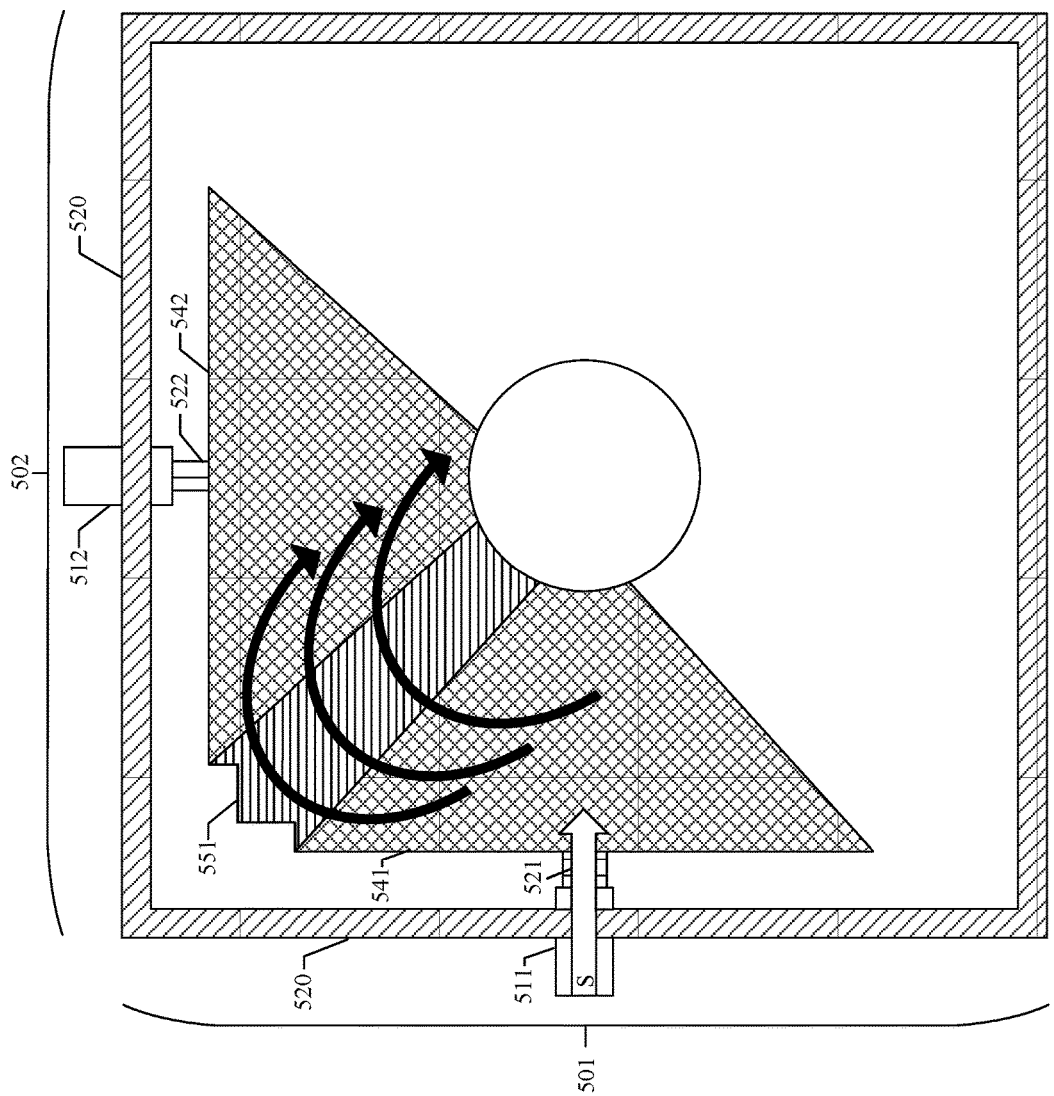
Figure 5I:
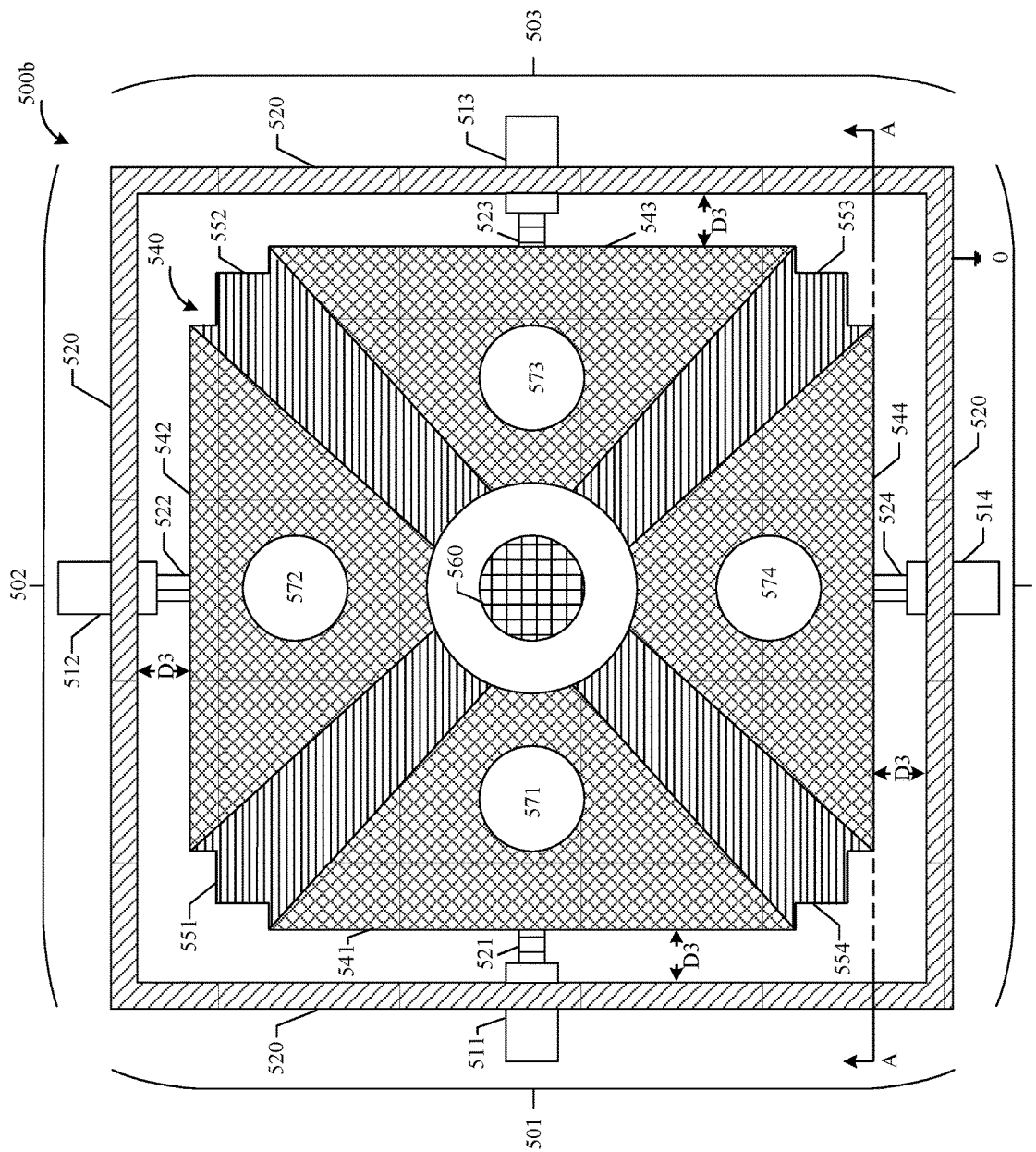
Figure 5J:
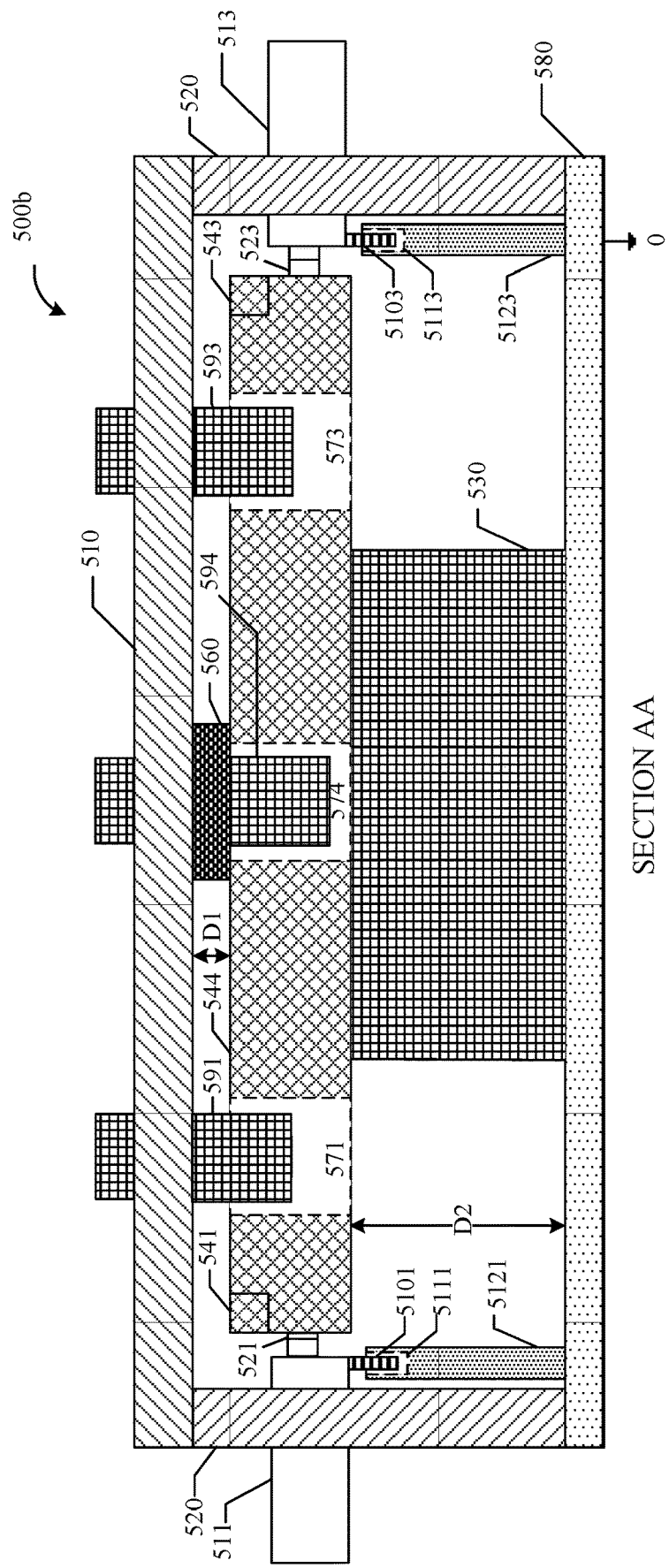
Figure 5K:
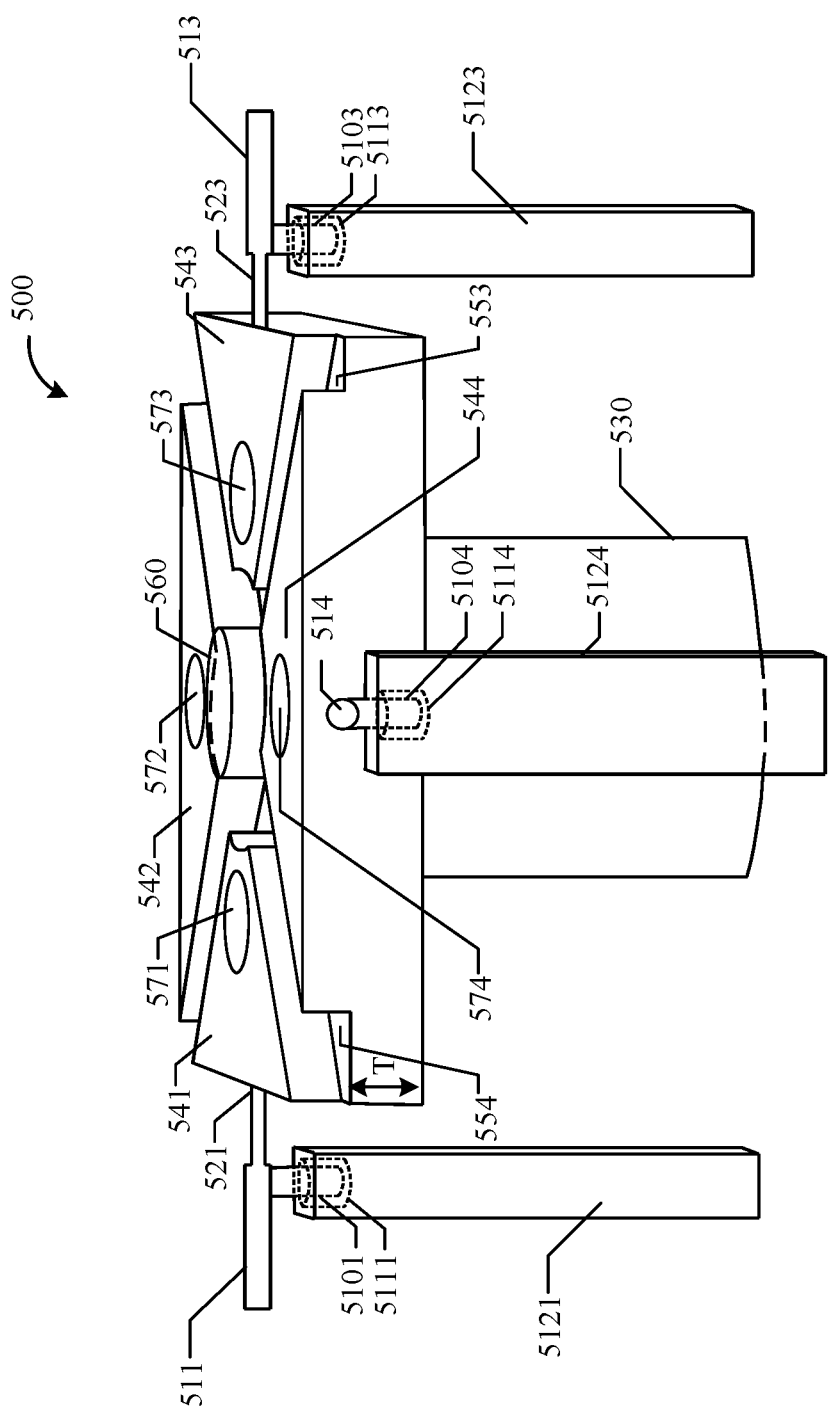

FIGS. 5I-5K is a diagram of a branch line coupler 500b in an embodiment. The branch line coupler 500b is similar to the branch line coupler 500 except that each metal piece includes one hole or cavity, i.e., a cavity 571 in the metal piece 541, a cavity 572 in the metal piece 542, a cavity 573 in the metal piece 543, and a cavity 574 in the metal piece 544. There may be four metal rods or screws 591-594 connected with cover 510 as shown in FIG. 5B. A diameter of each metal rods 591-594 may be less than a diameter of each cavity 571-574 on the corresponding metal piece 541-544, so that there is a small space or gap between the metal rod 591-594 and the metal piece 541-544. Each metal rod 591-594 may be extend at least partially into the cavities 571-574, but does not contact the sidewall of the cavity. Therefore, a capacitor may be formed by the gap between the metal rods 591-594 and the metal pieces 541-544. Because the metal rods 591-594 are connected to the cover 510, i.e., one end of the capacitors is a grounding end, such capacitors are therefore grounding capacitors. The metal rods 591-594 may be fixed to the cover 510. Alternatively, the metal rods 591-594 may be adjustable and move up and down with respect to the cover 510, namely, a length of the metal rods 591-594 extending into the cavities 571-574 could be adjusted. It should be understood that the metal rods 591-594 can be used to adjust the resonant frequency of the resonators R1-R4 501-504, and therefore affect the operating frequency of the branch line coupler 500. In some embodiments, the metal rods 591-594 include helical threads and can be extended further into or retracted from the cavities 571-574 by rotating the metal rods 591-594.

FIG. 5F is a diagram of another capacitor 5012b in the first resonator 501 in an embodiment. The signal S is inputted at the port 1 511, and is transmitted to the metal piece 541 through the port coupling 521. The metal piece 541 and the metal rod 591 form the capacitor 5012b. Because the metal rod 591 is connected to the cover 510, which is grounded, the one portion of the capacitor 50121 is grounded. Thus, the capacitor 5012b is a grounding capacitor.

It should be understood that the capacitor 5012 and the capacitor 5012b are two examples. The first resonator 501 may comprise more capacitor elements, such as capacitor elements formed by the metal piece 541 and at least one of the bottom 580, or the wall 520 at the right side in the figure. Each of these capacitor elements may contribute to a desired overall capacitance.

An inductor (or inductors) and a capacitor (capacitors) may form a resonator. Accordingly, four resonators R1-R4 501-504 of the branch line coupler 500 may be formed by the four metal pieces 541-544 and other components. A first resonator R1 501 includes a first distributed inductor (or inductors) and a first distributed capacitor (capacitors) which are connected in parallel. The first distributed inductor comprises the metal piece 541 and the metal base 530. The first distributed capacitor comprises the metal piece 541, and at least one of the cover 510, the wall 520, the bottom 580, or the metal rod 591. The first distributed capacitor has one end, i.e., the metal piece 541. At least one of the cover 510, the wall 520, the bottom 580, or the metal rod 591 form the other end of the first distributed capacitor. A second resonator R2 502, a third resonator R3 503, and a fourth resonator R4 504 can be similarly formed.

FIG. 5G is a diagram of the first resonator 501 in an embodiment. The first resonator 501 comprises the inductor 5011, which is as shown in FIG. 5D, and the capacitor 5012, which is as shown in FIG. 5E. The inductor 5011 and the capacitor 5012 have a common end, and both the other ends of the inductor 5011 and the capacitor 5012 are grounding, namely, the inductor 5011 and the capacitor 5012 are connected in parallel and form a parallel LC resonator (or LC circuit, where the letter L represents an inductor, and the letter C represents a capacitor). Optionally, in the case of more capacitors are formed as described above, such as the capacitor 5012b, the multiple capacitors and the inductor 5011 may form the parallel LC resonator.

It should be noted that for convenience, FIGS. 5D and 5F highlight the some components related to the first resonator. It does not mean the branch line coupler 500 in FIGS. 5D-5F only comprises these components.

FIG. 5H is a diagram of an inductive coupling k12 between the first resonator and the second resonator in an embodiment. A signal S is inputted into the metal piece 541 through the port coupling 521. A magnetic field is produced when the signal S is flowing through the metal piece 541. The magnetic field crosses the metal piece 542, and the signal can be generated on the metal piece 542. The signal on the metal piece 540 can also generate a magnetic field which crosses the magnetic field 541. Therefore, the first resonator 501 and the second resonator 502 are coupled by inductance. Optionally, a metal conductor 551 connects the metal piece 541 and the metal piece 542, and can conduct the signal S to the metal pieces 542. The more signals are transmitted to the metal pieces 542, the stronger inductance can be generated. The metal conductor 551 also can generate inductance to strength the coupling between the first resonator 501 and the second resonator 502. The other two adjacent resonators of the resonators 501-504 can be similarly coupled.

In another example, a signal is input at port 1 511, the signal is transmitted to from the metal piece 541 to the metal piece 542 through the metal conductor 551. Eddy currents are generated on the two metal pieces 541 and 542. The eddy current on the metal pieces 541 and 542 may generates magnetic fields. The two magnetic fields interact with each other and generate a mutual inductance. Therefore, the first resonator R1 501 and the second resonator R2 502 may be coupled by the mutual inductance. Optionally, the metal conductors 551-554 generate self-inductances when a signal is flowing, and a pair of adjacent resonators are coupled by the self-inductances. For instance, the first resonator R1 501 and the second resonator R2 502 are coupled by an inductance produced by the metal conductor 551 when signal is passing through the metal conductor 551. Similarly, the second resonator R2 502 and the third resonator R3 503 are coupled by an inductance produced by the metal conductor 552, the third resonator R3 503 and the fourth resonator R4

504 are coupled by an inductance produced by the metal conductor 553, and the fourth resonator R4 504 and the first resonator R1 501 are coupled by an inductance produced by the metal conductor 554.

Alternatively, in an embodiment, the branch line coupler 500 does not include the metal conductors 551-554, which is not shown in the figure, wherein a pair of adjacent resonators may be coupled by the mutual inductance.

The metal conductors 551-554 may be made in a shape of a slot or wedge as shown in FIGS. 5B and 5C. Alternatively, the shape of the metal conductors 551-554 may adjust the coupling strength between a pair of adjacent resonators. For example, a thickness of the T may adjust the amount of the signal transmitted from one metal piece to another, which can affect the strength of the magnetic field. Optionally, the inductance and/or the impedance of the metal conductors 551-554 can be adjusted to change the coupling strengthen between two resonators.

The branch line coupler 500 may further comprise an isolation component 560, such as a metal pillar 560. The isolation component 560 is placed among the four resonators R1-R4 501-504, and can isolate and prevent a coupling between the first resonator R1 501 and the third resonator R3 503, and isolate and prevent a coupling between the second resonator R2 502 and the fourth resonator R4 504. One end of the isolation component 560 connects to the cover 510 and the other end of the isolation component 560 connects to the bottom 580. Namely, the two ends of the isolation component 560 are grounded, wherein no cross-couplings can be formed between the first resonator R1 501 and the third resonator R3 503, and between the second resonator R2 502 and the fourth resonator R4 504. The isolation component 560 prevents inductance or capacitance from being generated, due to the two ends of the isolation components being grounded, or wherein the inductance or capacitance is weak enough so that the inductance or capacitance can be ignored.

Optionally, the ports 1-4 511-514 are connected to a corresponding grounding component GC1-GC4, e.g. a grounding capacitor. As shown in FIGS. 5B and 5C, port 1 511 in some embodiments is connected to a metal cylinder 5101, which is received in a receptacle 5111 formed in a top of a metal conductor 5121, and a predetermined space is existed between the metal cylinder 5101 and the metal conductor 5121. The metal conductor 5121 is connected to the bottom 580. Therefore, the metal cylinder 5101 and the metal conductor 5121 form a capacitor, with the metal cylinder 5101 comprising one end of the capacitor and the metal conductor 5121 comprising the other end, i.e., a grounding end of the capacitor. Similarly, the metal cylinders 5102-5104 and the metal conductors 5122-5124 can form such capacitors.

Optionally, there may be no space between each of the metal cylinders 5101-5104 and corresponding metal conductors 5121-5124. Namely, each of the metal cylinders 5101-5104 may contact the corresponding metal conductors 5121-5124, the metal cylinders 5101-5104 may be wrapped with an electrical insulator or dielectric material, or the receptacles 5111-5114 may be covered with an electrical insulator or dielectric. With the electrical insulator or dielectric, even though the metal cylinders 5101-5104 are positioned close to the metal conductors 5121-5124, the signal cannot be directly transmitted between them by electrical conduction. Therefore, a capacitance effect is generated by the metal cylinders 5101-5104 and the metal conductors 5121-5124, namely, distributed capacitors are formed.

Figure 6A:
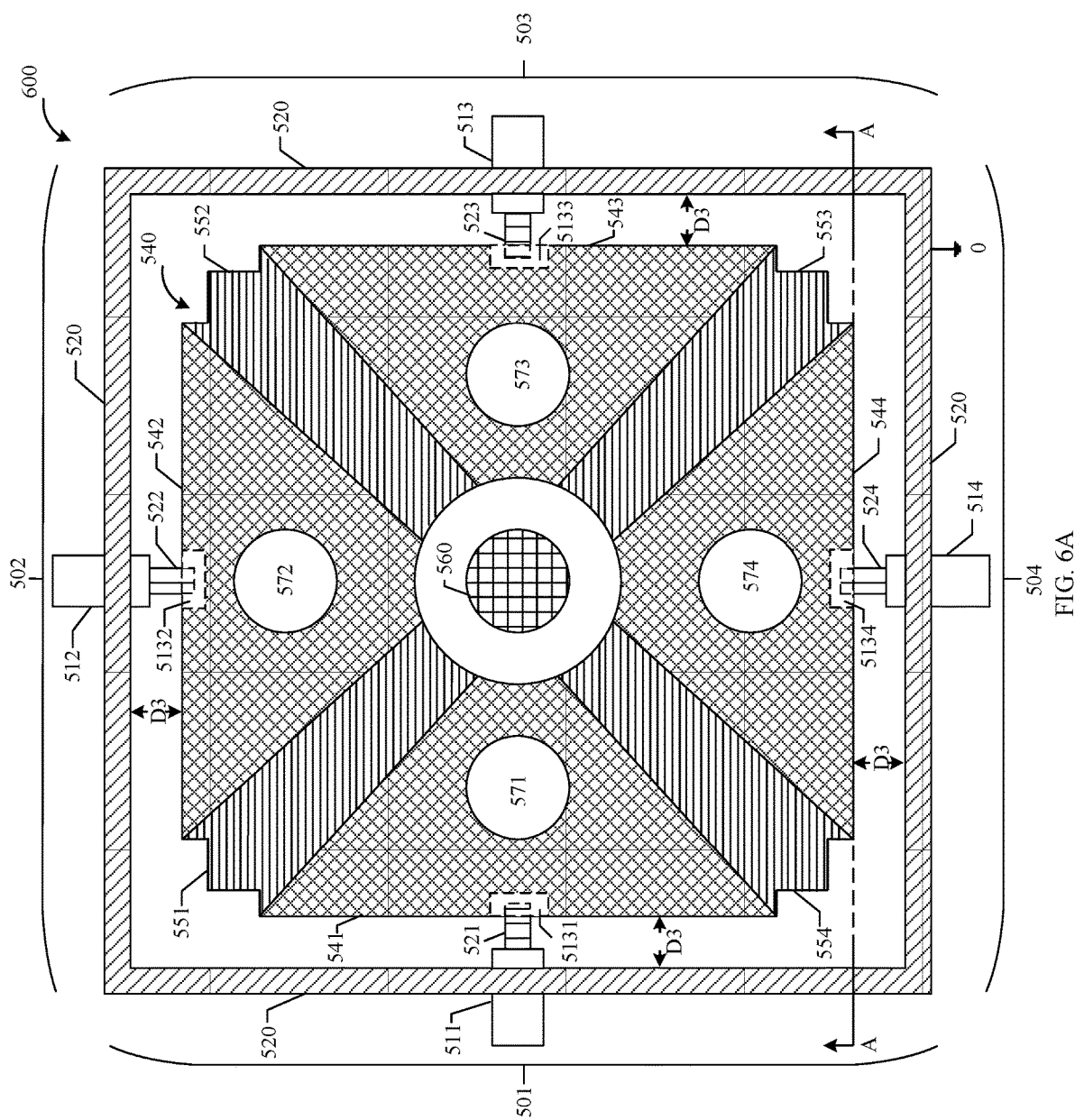
FIGS. 6A-6C are diagrams of a branch line coupler in embodiments.
Figure 6B:
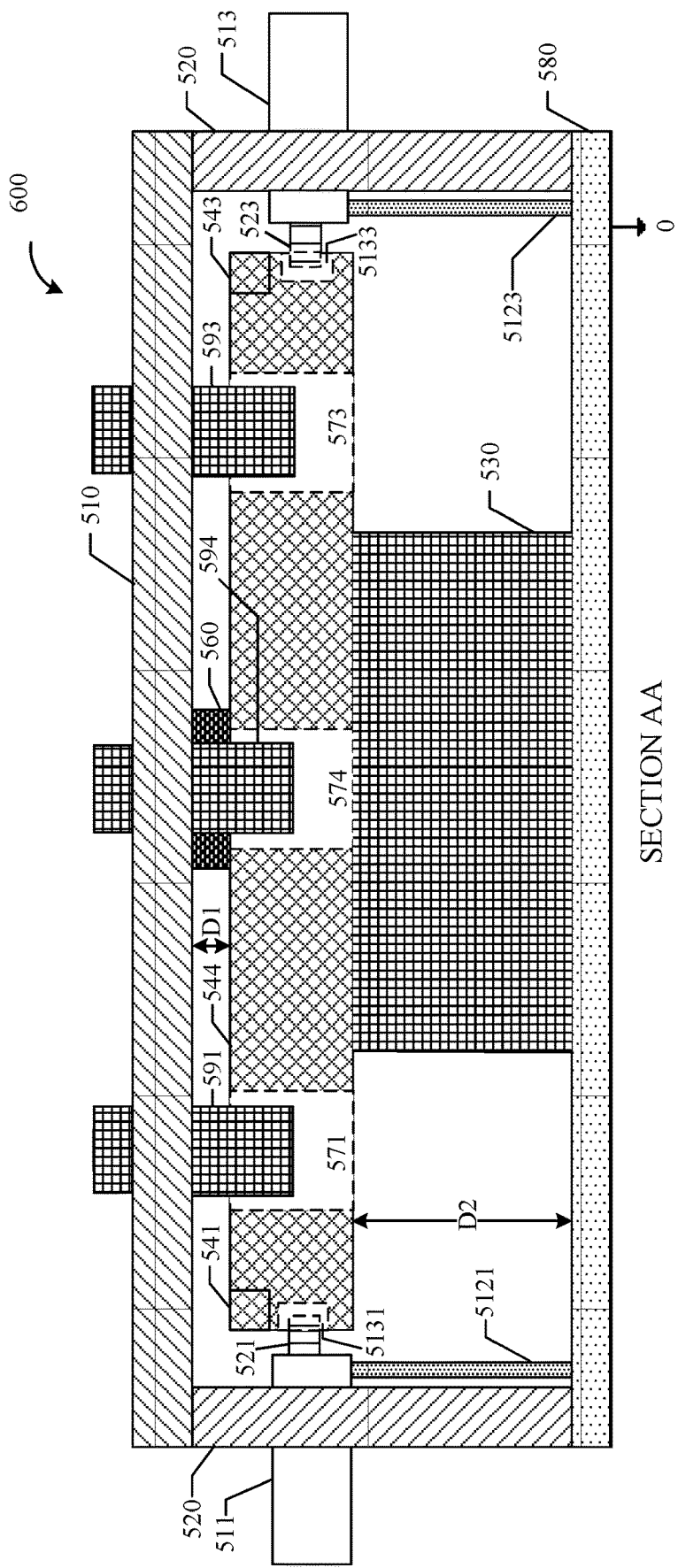
Figure 6C:
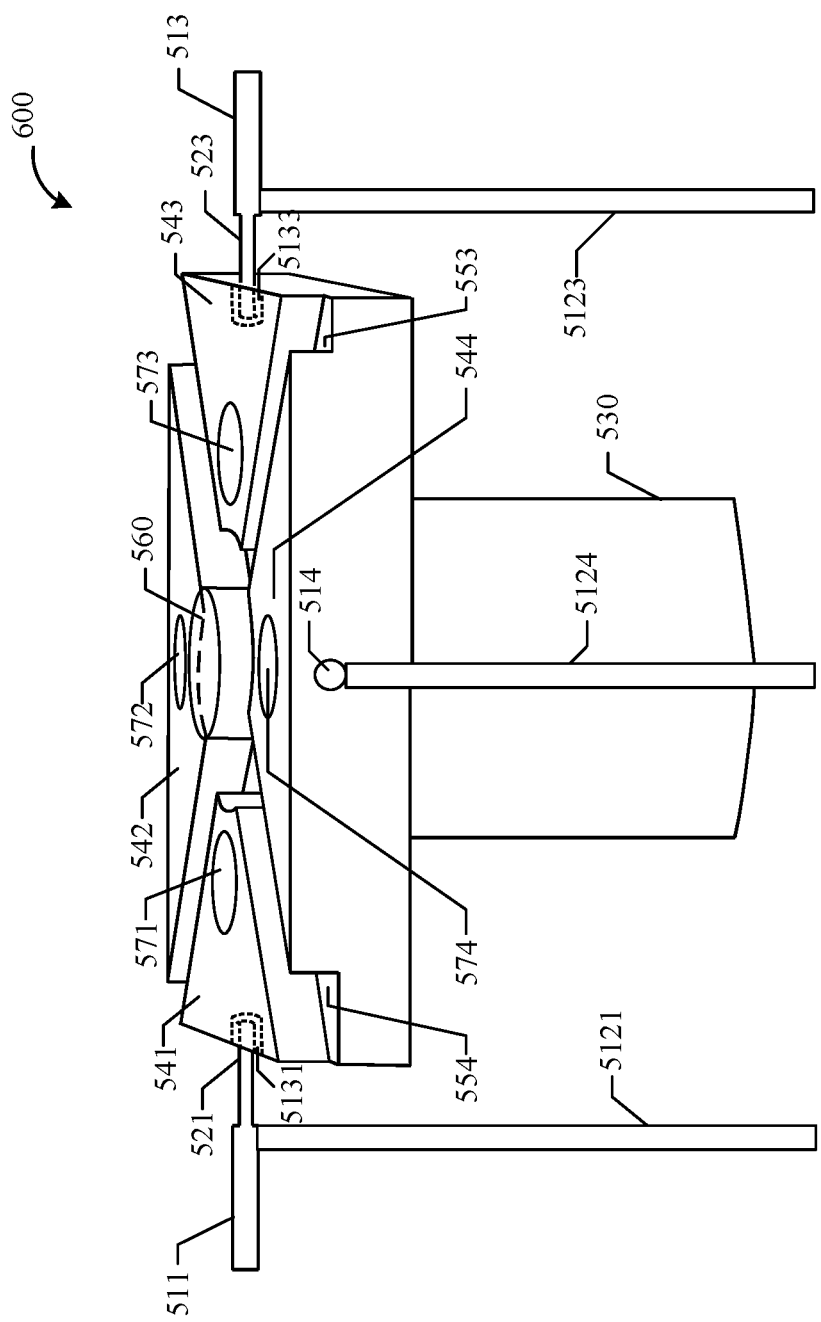

FIG. 6A-FIG. 6C are diagrams of a branch line coupler 600 in an embodiment. The branch line coupler 600 is similar to the branch line coupler 500b as illustrated by FIGS. 5D-5K except that the port couplings 521-524 of the branch line coupler 600 are capacitive couplings. The cavities 571-574 in FIGS. 6A-6C may also be optional, namely, the metal pieces 541-544 do not have the cavities 571-574. Optionally, the four ports 1-4 511-514 are connected with grounding components GC1-GC4, such as grounding inductors 5121-5124.

In this embodiment, the inductor 521 is received in a receptacle 5131 in the metal piece 541, and a predetermined space exists between the inductor 521 and the receptacle 5131. Thus, a capacitor is formed between the inductor 521 and the metal piece 541. Similarly, the inductors 522-524 and the metal pieces 542-544 can form such capacitors.

Optionally, there may be no space between each one of the inductors 521-524 and corresponding metal pieces 541-544. Namely, each one of the inductors 521-524 may contact the corresponding metal pieces 541-544, the inductors 521-524 may be wrapped with an electrical insulator or dielectric material, or the receptacles 5131-5134 may be covered with an electrical insulator or dielectric. With the insulating material, even though the inductors 521-524 are positioned close to the metal pieces 541-544, the signal cannot be directly transmitted between them. Therefore, a capacitance effect is generated between the inductors 521-524 and the metal pieces 541-544.

More details of the branch line coupler 500 and the branch line coupler 600 are similar to the branch line couplers 200 and 400 described above.

It is noted that shapes, positions, and sizes of the metal case and the components comprised in the branch line coupler 500 are not limited to what are shown in FIGS. 5A-5C, and shapes, positions, and sizes of the metal case and the components comprised in the branch line coupler 600 are not limited to what are shown in FIGS. 6A-6C.

Figure 7:
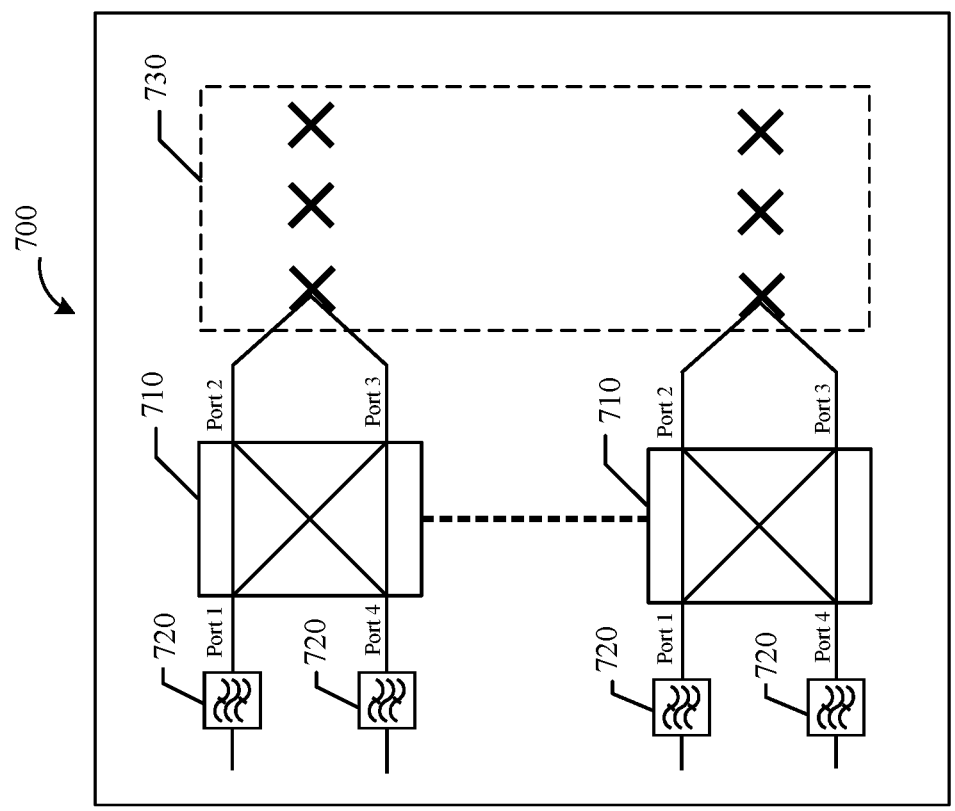
FIG. 7 is a diagram of an active antenna system in an embodiment.

FIG. 7 is a diagram of an active antenna system (AAS) 700 according to an embodiment. The AAS 700 may be used for advanced beam forming (ABF) in some embodiments. The AAS 700 comprises at least one branch line coupler 710, at least one frequency selecting component 720, and an antenna 730. In an example, the frequency selecting component 720 may comprise a filter or a diplexer.

The branch line couplers 710 may include four resonators, as in the branch line couplers described above. As an example, the branch line coupler 710 may comprise the branch line couplers 200, 400-600 as described above.

In operation, a signal is input into the branch line coupler 710 from the frequency selecting component 720, at port 1 of the branch line coupler 710. Two signals are output at port 2 and port 3 of the branch line coupler 710 and transmitted to the antenna 730. Similarly, another signal may also be input from the frequency selecting component 720 at port 4 of the branch line coupler 710, and two signals are output at port 2 and port 3 of the branch line coupler 710 and transmitted to the antenna 730. Conversely, the branch line coupler 720 can receive a signal from the antenna 730 at port 2 and transmit two signals at port 1 and port 4 to the frequency selecting component 720. The branch line coupler 720 may also receive a signal from the antenna 730 at port 3 then transmits two signals at port 1 and port 4 to the frequency selecting component 720. As a result, the signals to be transmitted on the antenna may have a better PIM performance (i.e. lower PIM levels). For example, the PIM could be lower than −120 dBm.

Furthermore, compared with the branch line couplers implemented by a single or multiple PCBs, where the branch line coupler 710 comprises resonators, an AAS provided by the embodiments of the present disclosure will have less fabrication complexity and will require less fabrication material. Thus, the fabrication cost is reduced accordingly. For example, the cost could be low as 30% of a cost of the branch line coupler made of multilayer PCBs.

If the branch line coupler 710 comprises a grounding capacitor or a grounding inductor at each port, for example, as the embodiments illustrated in FIGS. 4, 5A-5C, and 6A-6C, the AAS 700 may operate over a wider bandwidth. The bandwidth could be improved from 8% to at least 23% of a central frequency, more traffic throughput can be supported.

Furthermore, insertion loss is another important parameter for evaluating the performance of a branch line coupler. With the application of a branch line couple as provided by the embodiments of the present disclosure, the insertion loss, in an example, is smaller than 0.1 decibel (dB).

The AAS 700 as illustrated in FIG. 7 may be configured for different frequency bands and different numbers of transmitters and receivers. In one example, for a system supporting 2.6 GHz and with 8 transmitters and 8 receivers (8T8R), four branch line couplers may be included in the AAS 700.

In this embodiment, the frequency selecting component 720, such as the filter and the diplexer may be made in a form of a metal cavity in some examples. Since the branch line coupler 710 can also be in a form of a metal cavity, the frequency selecting component 720 and the branch line coupler 710 can be easily connected in the AAS 700 from a manufacture perspective. The manufacture difficulty and cost can be reduced accordingly.

Figure 8:
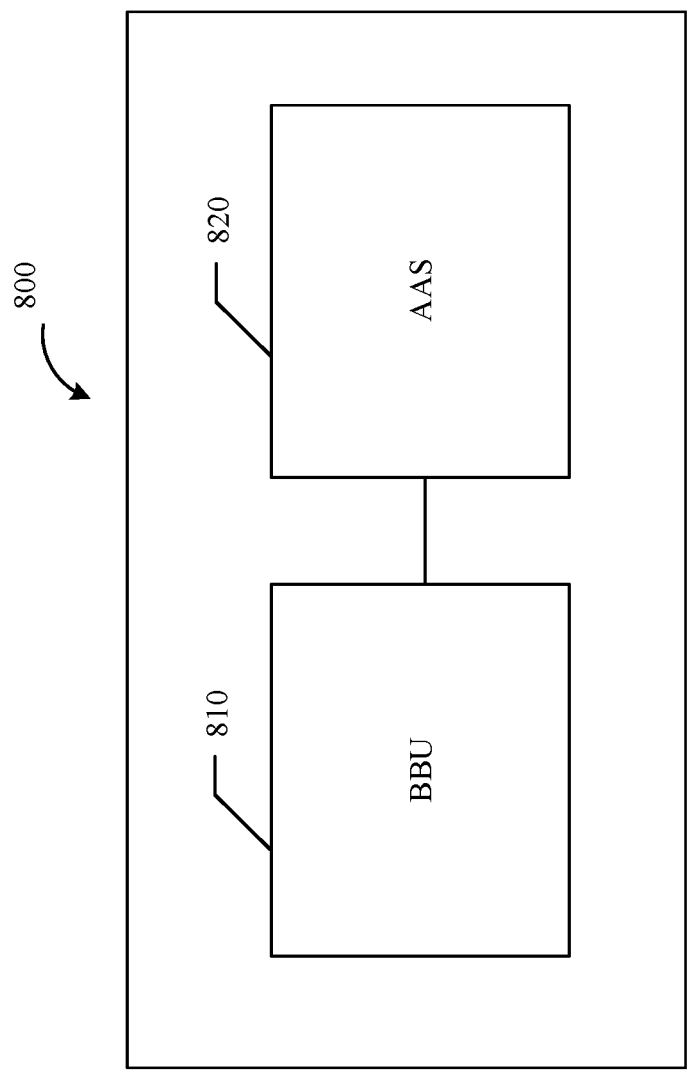
FIG. 8 is a diagram of a base station in an embodiment.

FIG. 8 is a diagram of a base station 800 according to an embodiment. The base station 800 comprises a baseband unit (BBU) 810 and an AAS 820 coupled to the BBU 810. It should be understood that additional components can be included in the base station 800, but are not shown for simplicity. The BBU 810 outputs a signal to the AAS 820. The BBU 810 can also receive a signal from the AAS 820. The BBU 810 may comprise a baseband processor that can generate and transmit signals to the AAs 820, and receive and process signals from the AAS 820. The AAS 820 may comprise the AAS 700 as described in FIG. 7. With the implementation of the AAS 820, which incorporates the branch line coupler described in embodiments of the present disclosure, the wireless transmission quality of the base station 800 is improved accordingly.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The terminology used in the description of the present disclosure is for the purpose of describing particular embodiments only and is not intended to be limiting of the present disclosure. As used in the description of the present disclosed and the appended claims, the singular forms "a", "an" and "the" are intended to include the plural forms as well, unless the context clearly indicates otherwise. In the embodiments of the present disclosure, "at least one" means one or multiple. The term "multiple" means two or more than two. The term "and/or" describes a relationship between the associated items. The term "and/or" may represent three relationships. For example, "A and/or B" may represent situations of A independently, A and B concurrently, and B independently. Where A and B could be singular or plural. The symbol "/" usually means "or" of the associated items. The expression "at least one item of" or similar expressions may mean any combination of the items, including any combination of singular item, or the plural of items. For instance, at least one of a, b, or c may comprise a, b, c, a plus b, a plus c, b plus c, or a plus b plus c, where a, b, c may be singular, or may be plural.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A branch line coupler, comprising:
   four resonators formed by a body and a grounded element, with a resonator of the four resonators comprising:
      a capacitor element, with a first portion of the capacitor element comprising at least a portion of the body and with a second portion comprising at least a portion of the grounded element;
      an inductor element connected to the capacitor element in parallel, with the inductor element comprising at least a portion of the body and extending to the grounded element;
   a first resonator and a second resonator of the four resonators are coupled by a first coupling, the second resonator and a third resonator of the four resonators are coupled by a second coupling, the third resonator and a fourth resonator of the four resonators are coupled by a third coupling, and the fourth resonator and the first resonator are coupled by a fourth coupling.

2. The branch line coupler according to claim 1, with each of the first coupling, the second coupling, the third coupling, and the fourth coupling comprising a corresponding capacitive coupling.

3. The branch line coupler according to claim 1, with each of the first coupling, the second coupling, the third coupling, and the fourth coupling comprising a corresponding inductive coupling.

4. The branch line coupler according to claim 1, further comprising a first port, a second port, a third port, and a fourth port;
   the first port is coupled to the first resonator by a first port coupling;
   the second port is coupled to the second resonator by a second port coupling;
   the third port is coupled to the third resonator by a third port coupling; and
   the fourth port is coupled to the fourth resonator by a fourth port coupling.

5. The branch line coupler according to claim 4, with each of the first port coupling, the second port coupling, the third port coupling, and the fourth port coupling comprising a corresponding inductive coupling.

6. The branch line coupler according to claim 5, with each of the first port, the second port, the third port, and the fourth port connected to a corresponding grounding capacitor.

7. The branch line coupler according to claim 4, with each of the first port coupling, the second port coupling, the third port coupling, and the fourth port coupling comprising a corresponding capacitive coupling.

8. The branch line coupler according to claim 7, with each of the first port, the second port, the third port, and the fourth port connected to a corresponding grounding inductor.

9. The branch line coupler according to claim 1, with the first coupling generating a ninety degree phase difference in a signal passing from the first resonator and the second resonator;
the second coupling generating a ninety degree phase difference in a signal passing from the second resonator and the third resonator;
the third coupling generating a ninety degree phase difference in a signal passing from the third resonator and the fourth resonator; and
the fourth coupling generating a ninety degree phase difference in a signal passing from the first resonator and the fourth resonator.

10. The branch line coupler according to claim 1, with the first coupling and the third coupling having a first coupling strength, the second coupling and the fourth coupling having a second coupling strength, and the second coupling strength equaling to the first coupling strength divided by $\sqrt{2}$.

11. An active antenna system, comprising:
a frequency selecting component, and
a branch line coupler coupled to the frequency selecting component and configured to receive a signal from the frequency selecting component, with the branch line coupler comprising:
four resonators formed by a body and a grounded element, with a resonator of the four resonators comprising:
a capacitor element, with a first portion of the capacitor element comprising at least a portion of the body and with a second portion comprising at least a portion of the grounded element;
an inductor element connected to the capacitor element in parallel, with the inductor element comprising at least a portion of the body and extending to the grounded element;
a first resonator and a second resonator of the four resonators are coupled by a first coupling, the second resonator and a third resonator of the four resonators are coupled by a second coupling, the third resonator and a fourth resonator of the four resonators are coupled by a third coupling, and the fourth resonator and the first resonator are coupled by a fourth coupling.

12. The active antenna system according to claim 11, with each of the first coupling, the second coupling, the third coupling, and the fourth coupling comprising a corresponding capacitive coupling.

13. The active antenna system according to claim 11, with each of the first coupling, the second coupling, the third coupling, and the fourth coupling comprising a corresponding inductive coupling.

14. The active antenna system according to claim 11, further comprising a first port, a second port, a third port, and a fourth port;
the first port is coupled to the first resonator by a first port coupling;
the second port is coupled to the second resonator by a second port coupling;
the third port is coupled to the third resonator by a third port coupling; and
the fourth port is coupled to the fourth resonator by a fourth port coupling.

15. The active antenna system according to claim 14, with each of the first port coupling, the second port coupling, the third port coupling, and the fourth port coupling comprising a corresponding inductive coupling.

16. The active antenna system according to claim 15, with each of the first port, the second port, the third port, and the fourth port connected to a corresponding grounding capacitor.

17. The active antenna system according to claim 14, with each of the first port coupling, the second port coupling, the third port coupling, and the fourth port coupling comprising a corresponding capacitive coupling.

18. The active antenna system according to claim 17, with each of the first port, the second port, the third port, and the fourth port connected to a corresponding grounding inductor.

19. The active antenna system according to claim 11, with the first coupling generating a ninety degree phase difference in a signal passing from the first resonator and the second resonator;
the second coupling generating a ninety degree phase difference in a signal passing from the second resonator and the third resonator;
the third coupling generating a ninety degree phase difference in a signal passing from the third resonator and the fourth resonator; and
the fourth coupling generating a ninety degree phase difference in a signal passing from the first resonator and the fourth resonator.

20. The active antenna system according to claim 11, with the first coupling and the third coupling having a first coupling strength, the second coupling and the fourth coupling having a second coupling strength, and the second coupling strength equaling of the first coupling strength divided by $\sqrt{2}$.

* * * * *